United States Patent
Wang et al.

(10) Patent No.: US 12,514,047 B2
(45) Date of Patent: Dec. 30, 2025

(54) DISPLAY PANEL AND DISPLAY DEVICE

(71) Applicant: Wuhan Tianma Micro-Electronics Co., Ltd., Wuhan (CN)

(72) Inventors: Lei Wang, Wuhan (CN); Pengcheng Mu, Wuhan (CN); Meihong Wang, Wuhan (CN); Hao Dai, Wuhan (CN); Yangzhao Ma, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 43 days.

(21) Appl. No.: 18/014,089

(22) PCT Filed: Oct. 28, 2021

(86) PCT No.: PCT/CN2021/126906
§ 371 (c)(1),
(2) Date: Dec. 30, 2022

(87) PCT Pub. No.: WO2023/010696
PCT Pub. Date: Feb. 9, 2023

(65) Prior Publication Data
US 2024/0274776 A1      Aug. 15, 2024

(30) Foreign Application Priority Data
Aug. 6, 2021   (CN) .......................... 202110902195.9

(51) Int. Cl.
*H10H 20/858*    (2025.01)
*H01L 25/075*    (2006.01)
(Continued)

(52) U.S. Cl.
CPC ..... *H10H 20/8582* (2025.01); *H01L 25/0753* (2013.01); *H01L 25/167* (2013.01);
(Continued)

(58) Field of Classification Search
CPC .............. H10K 50/87; H10K 59/8794; H10H 20/8582; H10D 86/60; H10D 86/481; G09G 2300/02; G09G 2300/04; G09G 2300/0469
See application file for complete search history.

(56) References Cited

U.S. PATENT DOCUMENTS

| 2017/0117345 A1* | 4/2017 | Seo ..................... H10K 59/131 |
| 2017/0329189 A1* | 11/2017 | Kim .................... G02F 1/13454 |

FOREIGN PATENT DOCUMENTS

| CN | 109859647 A | * | 6/2019 | ............ H01L 25/18 |
| CN | 112435586 A | * | 3/2021 | ............... G09F 9/30 |

OTHER PUBLICATIONS

International Search Report dated Apr. 26, 2022, for Application No. PCT/CN2021/126906 (nine (9) pages).

* cited by examiner

*Primary Examiner* — Monica D Harrison
*Assistant Examiner* — Jacob T Nelson
(74) *Attorney, Agent, or Firm* — KDW FIRM PLLC

(57) ABSTRACT

Provided are a display panel and a display device. The display panel includes a first display region and a second display region. The display panel further includes a pixel circuit, and the pixel circuit is configured to drive a light-emitting element to emit light. The distribution density of the pixel circuit in the first display region is less than the distribution density of the pixel circuit in the second display region. The first display region includes a compensation structure, and the compensation structure includes at least one layer of compensation film. The first display region further includes multiple first light-emitting elements, and the multiple first light-emitting elements each includes an anode. The anode at least partially overlaps the compensa-
(Continued)

tion structure in the first direction, and the first direction is perpendicular to a plane in which a substrate is located.

19 Claims, 11 Drawing Sheets

(51) Int. Cl.
*H01L 25/16* (2023.01)
*H10D 86/40* (2025.01)
*H10D 86/60* (2025.01)
*H10H 20/857* (2025.01)
*H10K 50/87* (2023.01)

(52) U.S. Cl.
CPC ........... *H10D 86/481* (2025.01); *H10D 86/60* (2025.01); *H10H 20/857* (2025.01); *H10H 20/8581* (2025.01)

DISPLAY PANEL AND DISPLAY DEVICE

CROSS-REFERENCE TO RELATED APPLICATIONS

This is a National Stage Application filed under 35 U.S.C. 371 based on International Patent Application No. PCT/CN2021/126906, filed on Oct. 28, 2021, which claims priority to Chinese Patent Application No. 202110902195.9 filed on Aug. 6, 2021, the disclosures of both of which are incorporated herein by reference in their entireties.

TECHNICAL FIELD

Embodiments of the present disclosure relate to the field of display technologies, for example, a display panel and a display device.

BACKGROUND

With the development of electronic products, such as mobile phones, including display panels and cameras, the requirements of people on these products have not only been limited to basic communication functions but also turned to design, artistry, and good visual experience. For example, electronic products with a high screen-to-body ratio are becoming more and more popular. A full screen has become an important development direction of electronic products. Earpieces, ambient light sensors, and proximity light sensors have all been successfully hidden under the screen, but front-facing cameras are difficult to hide.

In order to achieve the true full screen, front-facing cameras may be set under the screen. However, many problems to be solved urgently exist when front-facing cameras are set under the full screen.

SUMMARY

The present disclosure provides a display panel and a display device to solve the problems brought by setting the front-facing camera under the screen in the related art.

In a first aspect, an embodiment of the present disclosure provides a display panel. The display panel includes a first display region and a second display region.

The display panel further includes pixel circuits, and the pixel circuits are configured to drive light-emitting elements to emit light. The distribution density of the pixel circuits in the first display region is less than the distribution density of the pixel circuits in the second display region.

The first display region includes a compensation structure, and the compensation structure includes at least one layer of compensation film.

The first display region further includes multiple first light-emitting elements, and the multiple first light-emitting elements each includes an anode. The anode at least partially overlaps the compensation structure in the first direction. The display panel further includes a substrate, and the first direction is perpendicular to a plane in which the substrate is located.

In a second aspect, an embodiment of the present disclosure further provides a display device. The display device includes the display panel described in the first aspect.

DETAILED DESCRIPTION

Hereinafter the present disclosure is described in detail in conjunction with the drawings and embodiments.

Figure 1:
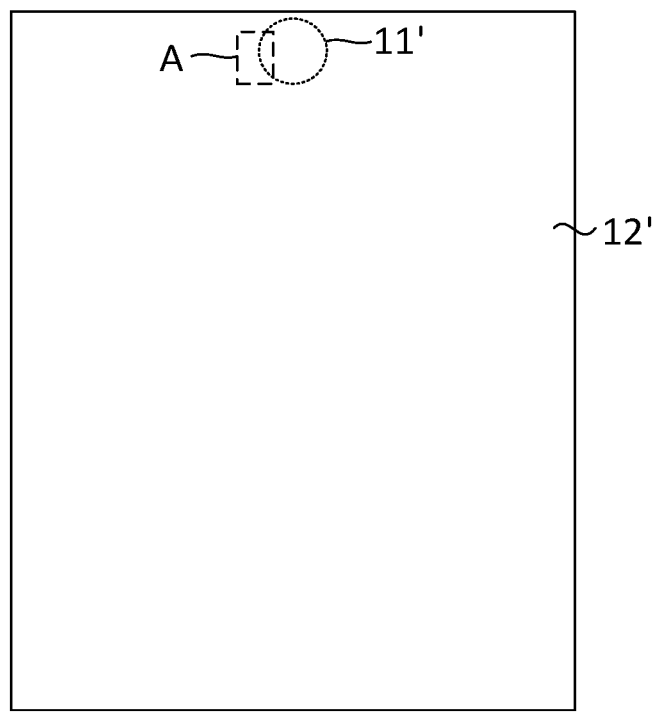
FIG. 1 is a diagram illustrating the structure of a display panel in the related art.
Figure 2:
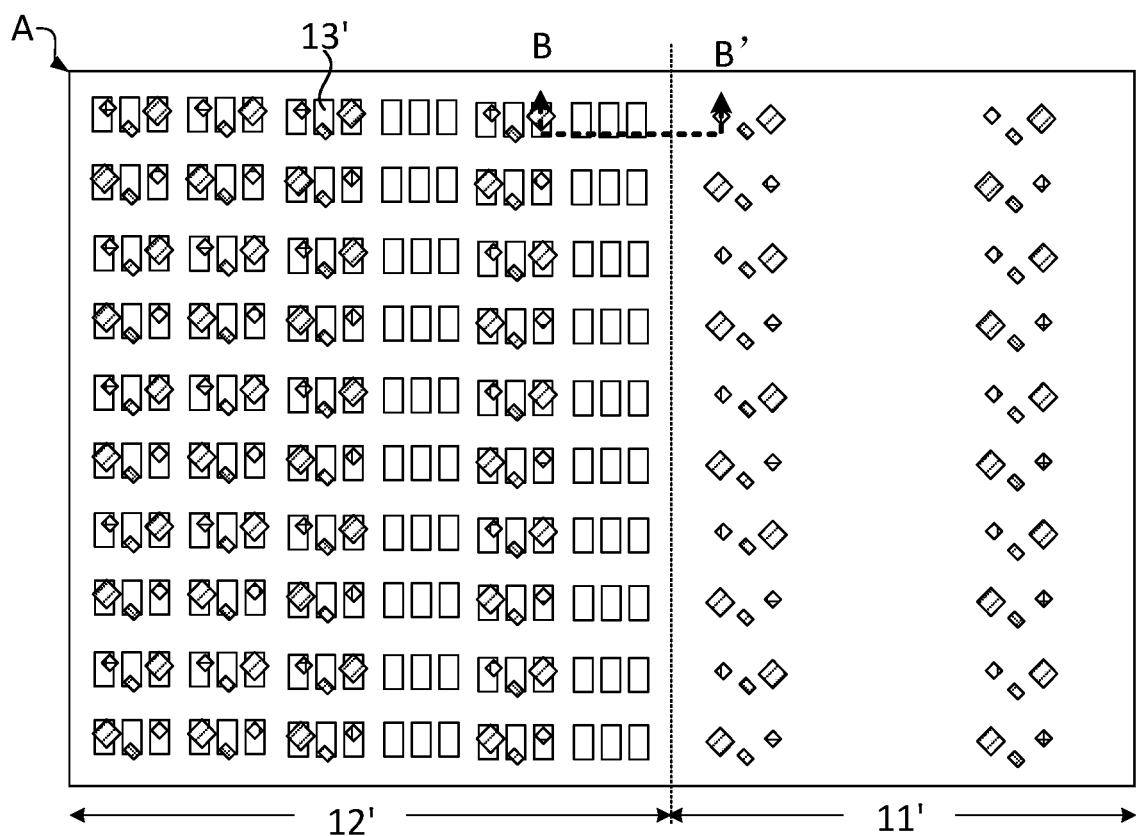
FIG. 2 is an enlarged structure diagram of area A of FIG. 1.
Figure 3:
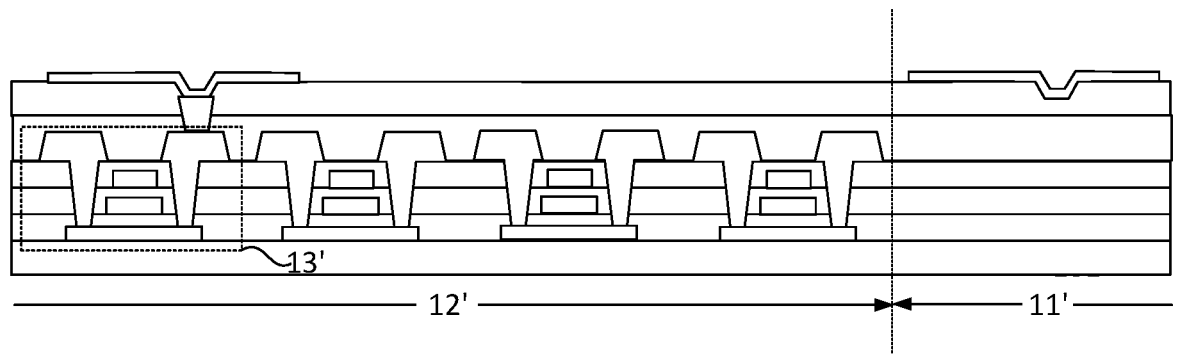
FIG. 3 is a section view taken along direction B-B' of FIG. 2.

FIG. 1 is a structure diagram of a display panel according to an embodiment of the present disclosure, FIG. 2 is an enlarged structure diagram of area A of FIG. 1, and FIG. 3 is a section view taken along direction B-B' of FIG. 2. As shown in FIGS. 1 to 3, the display panel provided by the embodiment of the present disclosure includes a first display region 11' and a second display region 12'. The first display region 11' may also serve as a sensor reservation area, such as a camera reservation area. Therefore, the first display region 11' not only has the normal display function but also has a good light transmitting effect to ensure that external light can enter a camera through the first display region 11'. In the display region of the display panel, a pixel circuit serves as the main light-shielding element. Therefore, to ensure that the first display region 11' has a good light transmitting effect, the distribution density of pixel circuits 13' in the first display region 11' needs to be less than the distribution density of pixel circuits 13' in the second display region 12'. As shown in FIG. 3, FIG. 3 describes the first display region 11' with no pixel circuit as an example.

However, the inventors have found that, when the distribution density of pixel circuits in the first display region 11' needs to be less than the distribution density of pixel circuits in the second display region 12', the first display region 11' has the problem of poor heat dissipation capacity, which can affect the light-emitting effect of light-emitting elements in the first display region 11' and affect the normal display of the display panel.

In an embodiment of the present disclosure, a display panel includes a first display region and a second display region. The display panel further includes a pixel circuit, and the pixel circuit is configured to drive a light-emitting element to emit light. The distribution density of the pixel circuit in the first display region is less than the distribution density of the pixel circuit in the second display region. The first display region includes a compensation structure, and the compensation structure includes at least one layer of compensation film. The first display region further includes multiple first light-emitting elements, and multiple first light-emitting elements each includes an anode. The anode at least partially overlaps the compensation structure in the first direction. The display panel further includes a substrate, and the first direction is perpendicular to a plane in which the substrate is located. According to the above technical solution, the compensation structure compensates for the heat dissipation problem caused by the smaller distribution density of pixel circuits in the first display region, and the heat dissipation capacity of the first display region is improved. In the direction perpendicular to the plane in which the substrate is located, the anode of the light-emitting element in the first display region at least partially overlaps the compensation structure, that is, the anode covers at least part of the compensation structure, to ensure that the setting of the compensation structure does not affect the light transmitting effect of the first display region and the light transmitting effect of the first display region is good.

The technical solutions in the embodiments of the present disclosure are described clearly and completely hereinafter in conjunction with the drawings in the embodiments of the present disclosure.

Figure 4:
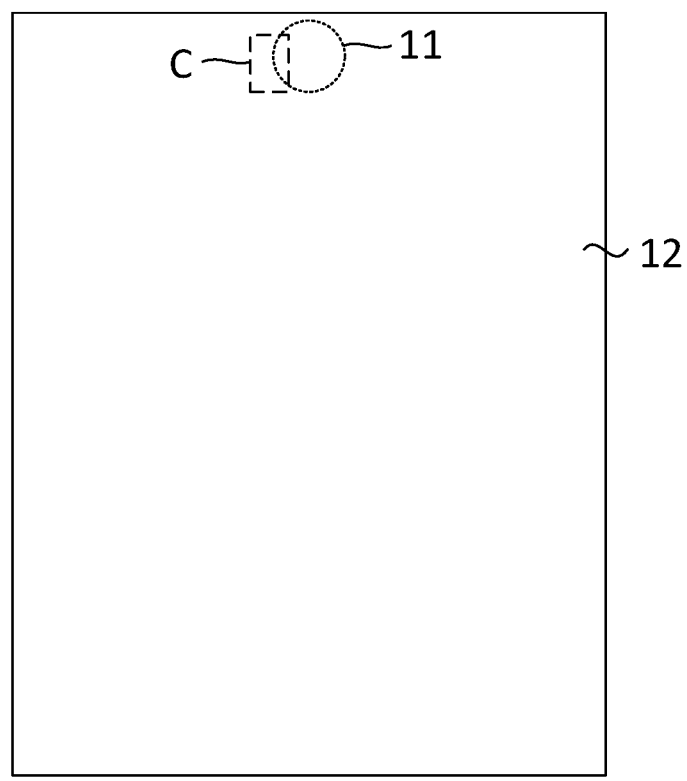
FIG. 4 is a structure diagram of a display panel according to an embodiment of the present disclosure.
Figure 5:
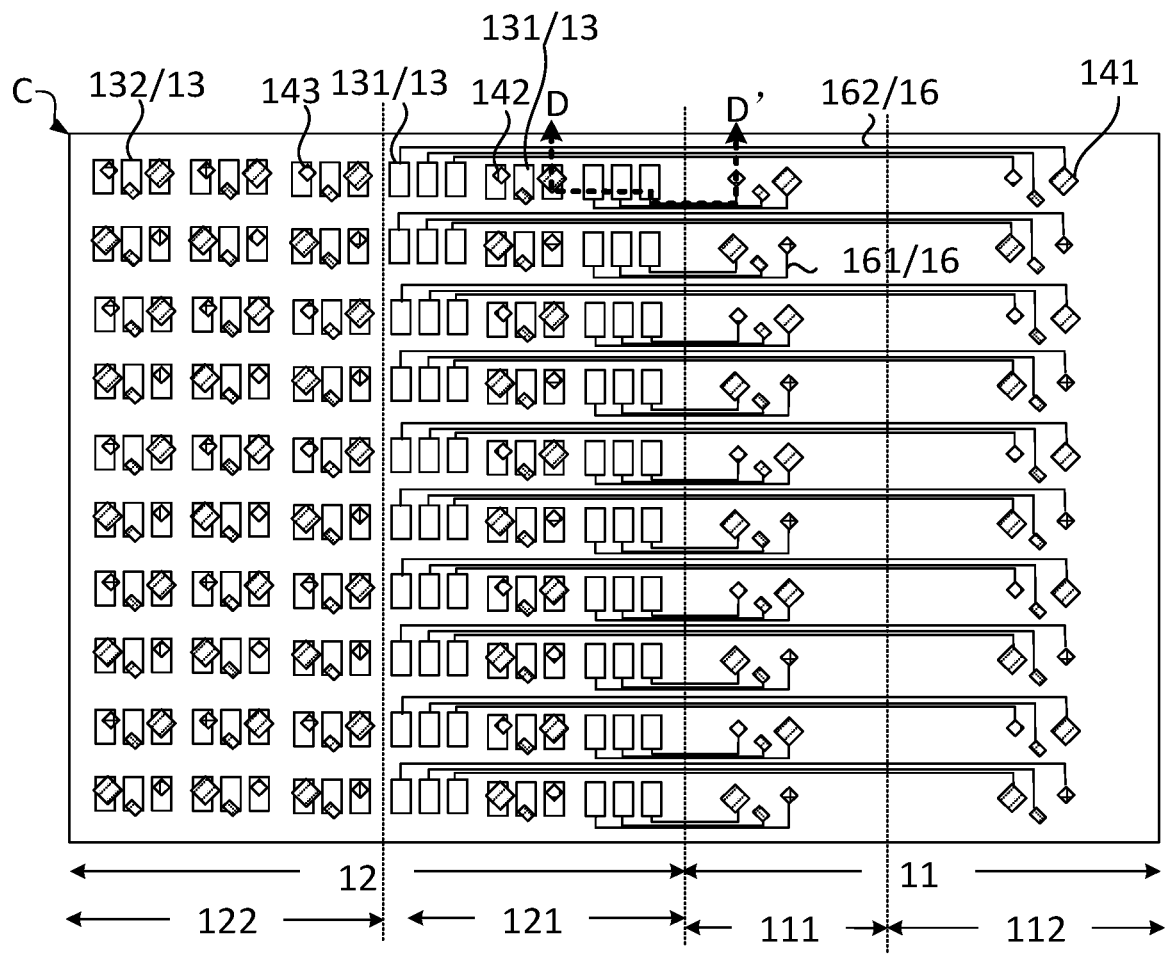
FIG. 5 is an enlarged structure diagram of area C of FIG. 4.
Figure 6:
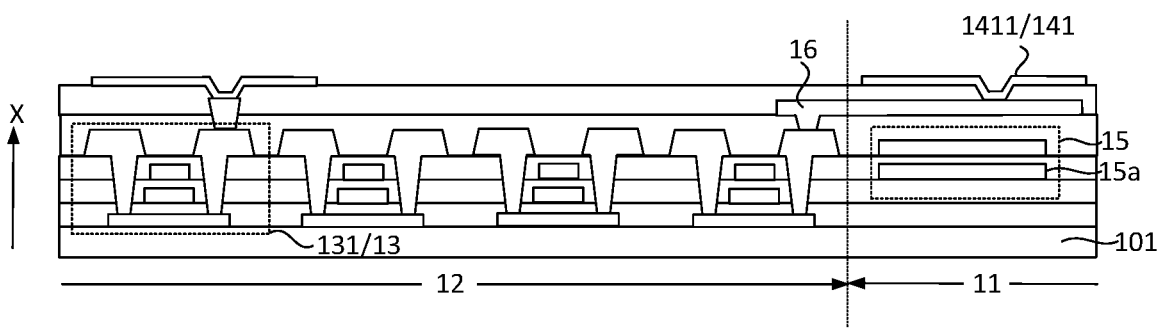
FIG. 6 is a section view taken along direction D-D' of FIG. 5.

FIG. 4 is a structure diagram of a display panel according to an embodiment of the present disclosure, FIG. 5 is an enlarged structure diagram of area C of FIG. 4, and FIG. 6 is a section view taken along direction D-D' of FIG. 5. As shown in FIG. 4, FIG. 5 and FIG. 6, the display panel 10 provided by the embodiment of the present disclosure includes a first display region 11 and a second display region 12. The display panel 10 further includes a pixel circuit 13, and the pixel circuit 13 is configured to drive a light-emitting element to emit light. The distribution density of the pixel circuit 13 in the first display region 11 is less than the distribution density of the pixel circuit 13 in the second display region 12. The first display region 11 includes a compensation structure 15, and the compensation structure 15 includes at least one layer of compensation film 15a. The first display region 11 further includes multiple first light-emitting elements 141, and multiple first light-emitting elements 141 each includes an anode 1411. The anode 1411 at least partially overlaps the compensation structure 15 in the first direction (the direction X shown in the figure). The display panel 10 further includes a substrate 101, and the first direction is perpendicular to a plane in which the substrate 101 is located.

As shown in FIGS. 4 to 6, the display panel according to the embodiment of the present disclosure is applicable to a display device with a sensor under the screen. The display panel includes the first display region 11 and the second display region 12, and the first display region 11 may also serve as the placement area for the sensor. The sensor may be a camera, an infrared transducer, or the like, which is not limited in the embodiment of the present disclosure.

Continuing to refer to FIGS. 4 to 6, for example, the display panel 10 further includes the pixel circuit 13, and the pixel circuit 13 is configured to drive a light-emitting element in the display panel 10 to emit light. For example, the pixel circuit 13 may include a thin-film transistor and may also include multiple thin-film transistors and at least one storage capacitor, such as seven thin-film transistors and one storage capacitor (7T1C). The structure of the pixel circuit 13 is not limited in the embodiment of the present disclosure. FIG. 6 only shows one thin-film transistor in the pixel circuit 13. The pixel circuit 13 includes multiple metal films, and the light-transmissive performance of the metal films is poor. Thus, in a case where the first display region 11 also serves as the placement area for the sensor, the distribution density of pixel circuits 13 in the first display region 11 may be set to be less than the distribution density of pixel circuits 13 in the second display region 12, thereby ensuring that the light-transmissive performance of the first display region 11 is good.

The light-emitting process of the light-emitting element in the display panel 10 is accompanied by heat generation, and multiple metal films in the pixel circuit 13 have a good heat dissipation effect. Therefore, the region in which the distribution density of pixel circuits is relatively large has a good heat dissipation effect, and the region in which the distribution density of pixel circuits is relatively small has a relatively poor heat dissipation effect, that is, the first display region 11 has a problem of a relatively poor heat dissipation capability, which results from the distribution density of pixel circuits is relatively small. In the embodiment of the present disclosure, the first display region 11 includes the compensation structure 15, and the compensation structure 15 includes at least one layer of compensation film 15a. The heat dissipation capability of the first display region 11 is compensated by using the compensation structure 15, ensuring that the first display region 11 has a good heat dissipation effect. Furthermore, the heat dissipation capability of the first display region 11 is compensated by using the compensation structure 15, ensuring that the heat dissipation capability of the first display region 11 and the heat dissipation capability of the second display region 12 are the same or similar, ensuring that the influence of heat on light-emitting elements in the first display region 11 and light-emitting elements in the second display region 12 is the same or similar, ensuring that the light-emitting effect of light-emitting elements in the first display region 11 and in the second display region 12 is the same or similar, and ensuring that the display uniformity of the display panel is good.

As shown in FIG. 6, the display panel further includes the substrate 101, and the compensation structure 15 is located on a side of the anode 1411 closer to the substrate 101. In the first direction (the direction X shown in the figure), the anode 1411 at least partially overlaps the compensation structure 15, that is, the anode 1411 at least partially covers the compensation structure 15, thereby ensuring that the setting of the compensation structure 15 does not affect the light transmitting effect of the first display region 11, ensuring that the light transmitting effect of the first display region is good.

In summary, according to the display panel provided by the embodiment of the present disclosure, the compensation structure compensates for the heat dissipation problem caused by the smaller distribution density of pixel circuits in the first display region, and the heat dissipation capacity of the first display region is improved. In the direction perpendicular to the plane in which the substrate is located, the anode of the light-emitting element in the first display region at least partially overlaps the compensation structure, that is, the anode covers at least part of the compensation structure, to ensure that the setting of the compensation structure does not affect the light transmitting effect of the first display region and the light transmitting effect of the first display region is good.

Based on the above-mentioned embodiment, there are many different implementations in which the distribution density of pixel circuits in the first display region is less than the distribution density of pixel circuits in the second display region. Two different implementations are described below as examples.

First, a pixel circuit disposed in the second display region is described as an example.

Continuing to refer to FIGS. 5 and 6, a pixel circuit 13 is disposed in the second display region 12, and no pixel circuit 13 is disposed in the first display region 11, thus ensuring that the first display region 11 has a good light transmitting effect.

Based on the above-mentioned embodiment, in a case where a pixel circuit is disposed in the second display region, there may be multiple different arrangements of the compensation structure. The arrangement of the compensation structure is described below.

Continuing to refer to FIG. 6, in an optional embodiment, the compensation structure 15 is at a suspended potential.

For example, the compensation structure 15 at a suspended potential can be understood as a compensation structure 15 not connected to a circuit element. Without regard to signal interference, no voltage signal is applied to the compensation structure 15. The compensation structure 15 at a suspended potential compensates for the heat dissipation problem caused by the smaller distribution density of the pixel circuit in the first display region, and the heat dissipation capacity of the first display region is improved. The compensation structure 15 is suspended and not connected to a circuit element, and thus the arrangement of the compensation structure 15 is simple. Furthermore, the compensation structure 15 is suspended, and thus the arrangement of the compensation structure 15 does not interfere with normal light-emitting display of the first light-emitting element 141, thereby ensuring that the first light-emitting element 141 in the first display region 11 has a good display effect.

Figure 7:
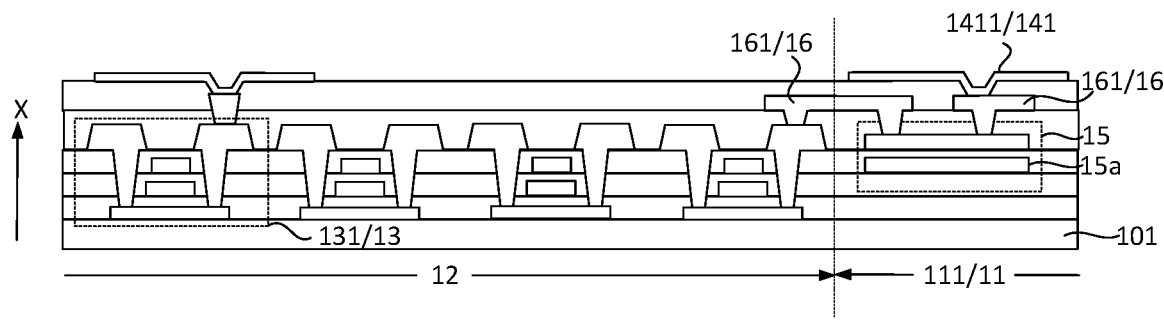
FIG. 7 is another section view taken along direction D-D' of FIG. 5.
Figure 8:
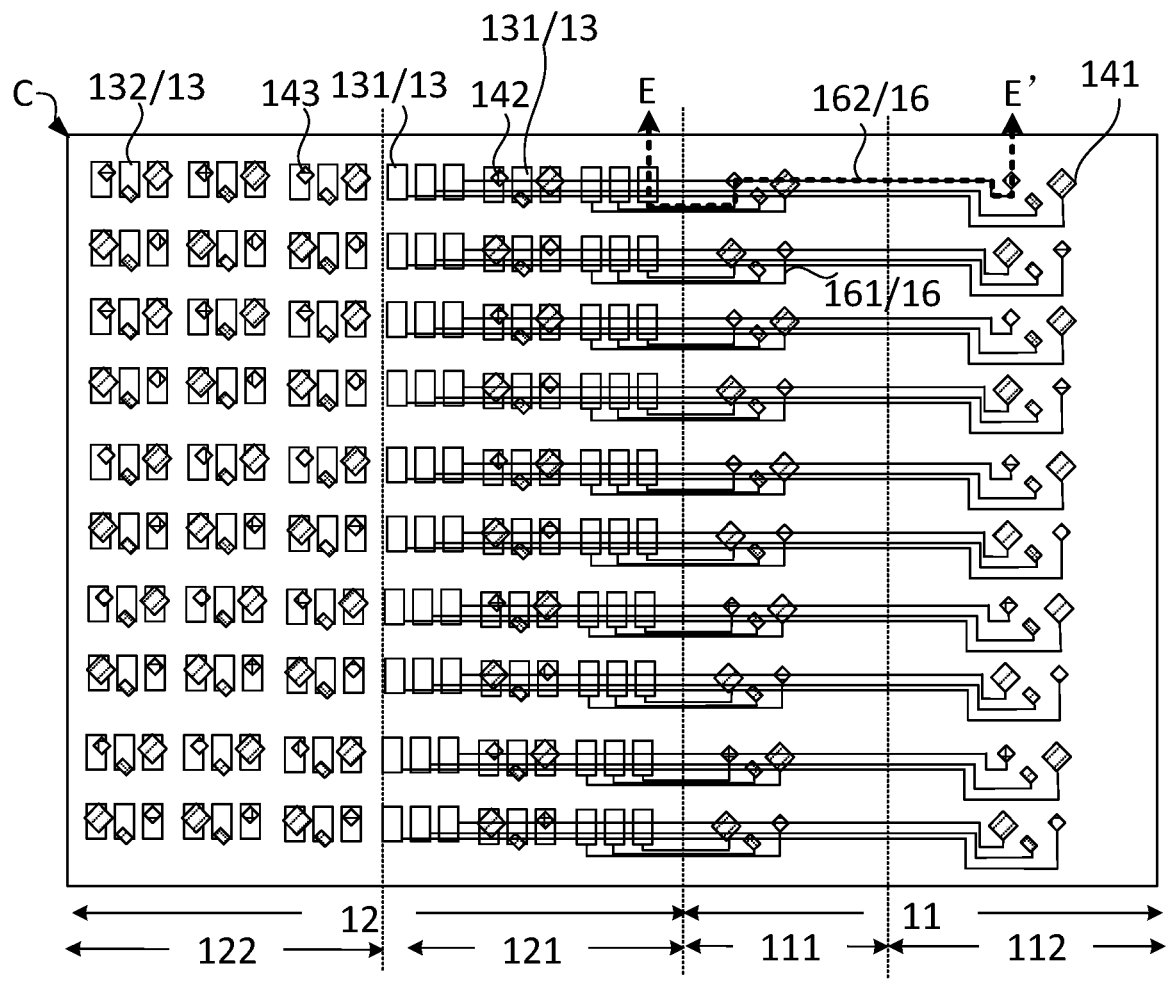
FIG. 8 is another enlarged structure diagram of area C of FIG. 4.
Figure 9:
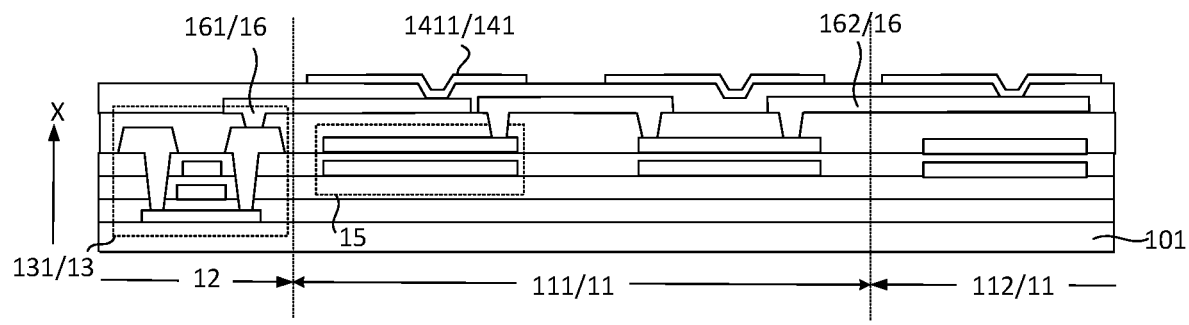
FIG. 9 is a section view taken along direction E-E' of FIG. 8.

FIG. 7 is another section view taken along direction D-D' of FIG. 5, FIG. 8 is another enlarged structure diagram of area A of FIG. 1, and FIG. 9 is a section view taken along direction E-E' of FIG. 8. As shown in FIG. 7, FIG. 8 and FIG. 9, in another optional embodiment, a display signal is transmitted in the compensation structure 15.

For example, the transmission of the display signal in the compensation structure 15 can be understood to mean that the compensation structure 15 is located on the transmission path of the display signal, and the compensation structure 15 transmits the display signal required for the normal display of the first light-emitting element 141 to the first light-emitting element 141. More specifically, the compensation structure 15 transmits the display signal required for the normal display of the first light-emitting element 141 to the anode 1411 of the first light-emitting element 141, thereby ensuring the normal display of the first light-emitting element 141. In other words, the compensation structure 15 has the function of compensating for heat dissipation and transmitting the display signal. The anode 1411 at least partially covers the compensation structure 15 in the first direction (the direction X shown in the figure), the transmission of the display signal to the first light-emitting element 141 by using the compensation structure 15 does not affect the light transmittance of the first display region 11, and thus good light transmittance of the first display region 11 and normal transmission of the display signal are both satisfied. For example, the compensation structure 15 may include metal material. Since the resistivity of the metal material is relatively small, the loss of the display signal can be ensured to be relatively small by using the compensation structure 15 to transmit the display signal, thereby ensuring that the display panel has a good display effect.

The following describes how the compensation structure 15 transmits the display signal.

Continuing to refer to FIGS. 6 to 9, the display panel 10 further includes a transparent signal transmission line 16, and the transparent signal transmission line 16 is disposed between a film in which the anode 1411 is located and a film in which the compensation structure 15 is located. The pixel circuit 13 is electrically connected to the anode 1411 via the transparent signal transmission line 16 and the compensation structure 15.

For example, since the pixel circuit 13 is disposed in the second display region 12, a signal transmission line needs to be provided to connect the first light-emitting element 141 in the first display region 11 and the pixel circuit 13 in the second display region 12. In the embodiment of the present disclosure, to ensure a good light transmitting effect of the first display region 11, the transparent signal transmission line 16 and the compensation structure 15 achieve electrical connection between the first light-emitting element 141 and the pixel circuit 13. For example, the transparent signal transmission line 16 may be indium tin oxide (ITO), ensuring good light transmission and electrical conductivity. The compensation structure 15 may include metal material, the resistivity of the metal material is relatively small, and thus compared with the transmission of the display signal by only using the transparent signal transmission line 16, the transmission of the display signal by using the transparent signal transmission line 16 and the compensation structure 15 can ensure that the loss of the display signal is relatively small and that the display panel has a good display effect.

For example, a display signal is transmitted in the compensation structure 15. The compensation structure 15 may transmit the display signal to the anode 1411 which is directly above the compensation structure 15, that is, in the first direction (the direction X shown in the figure), the compensation structure 15 transmits the display signal to the anode covering the compensation structure 15. The compensation structure 15 may also transmit the display signal to the anode 1411 which is not directly above the compensation structure 15, that is, in the first direction (the direction X shown in the figure), the compensation structure 15 transmits the display signal to the anode not covering the compensation structure 15. The following describes the manners separately.

Preferably, the compensation structure transmits the display signal to the anode that is directly above the compensation structure, and this manner is described as an example.

Continuing to refer to FIGS. 5 and 7, the first display region 11 includes a first display sub-region 111 located closer to a side of the second display region 12. The pixel circuit 13 is electrically connected to the anode 1411 of the light-emitting element in the first display sub-region 111 via the transparent signal transmission line 16 and the compensation structure 15.

As shown in FIGS. 5 and 7, a transparent signal line 16 includes a first transparent signal line 161, and the display signal provided by the pixel circuit 13 is transmitted to the anode 1411 through the first transparent signal line 161, the compensation structure 15, and the first transparent signal line 161 in sequence, that is, the display signal is transmitted by a combination of the transparent signal transmission line 16 and the compensation structure 15, thereby ensuring that the loss of the display signal is relatively small and that the display panel has a good display effect.

It is to be noted that FIG. 7 only describes the display signal that is transmitted to the anode 1411 through the first transparent signal line 161, the compensation structure 15, and the first transparent signal line 161 in sequence as an example. The compensation structure 15 may also be directly electrically connected to the anode 1411, that is, the display signal is transmitted to the anode 1411 through the first transparent signal line 161 and the compensation structure 15 in sequence, which is not limited in embodiments of the present disclosure. The display signal is transmitted to the anode 1411 through the first transparent signal line 161, the compensation structure 15, and the first transparent signal line 161 in sequence, thereby avoiding deep drilling used for electrical connection between the anode 1411 and the compensation structure 15, and ensuring that the punching is simple. The display signal is transmitted to the anode 1411 through the first transparent signal line 161 and the compensation structure 15 in sequence, thereby reducing the number of punched holes, and ensuring that the punching is simple.

Continuing to refer to FIG. 5, the first display region 11 may further include a second display sub-region 112 located on a side of the first display sub-region 111 facing away from the second display region 12. Correspondingly, a second transparent signal line 15 further includes a second transparent signal line 162, and the pixel circuit 13 may be electrically connected to the anode 1411 of the light-emitting element in the second display sub-region 112 via the second transparent signal transmission line 162 and the compensation structure 15, that is, the transparent signal transmission line 16 and the compensation structure 15 are both used to transmit the display signal, thereby ensuring that the loss of the display signal is relatively small and that the display panel has a good display effect. For example, in the same transmission manner as the display signal in the first display sub-region 111, the display signal may be transmitted to the anode in the second display sub-region 112 through the second transparent signal line, the compensation structure, and the second transparent signal line in sequence. The compensation structure may also be directly electrically connected to the anode, that is, the display signal is transmitted to the anode in the second display sub-region through the second transparent signal line and the compensation structure 15 in sequence. For a corresponding technical effect, reference may be made to the foregoing, and details are not repeated here.

Next, an example is described in which the compensation structure 15 transmits the display signal to the anode 1411 that is not directly above the compensation structure 15.

Continuing to refer to FIGS. 8 and 9, the first display region 11 includes a first display sub-region 111 located closer to a side of the second display region 12 and a second display sub-region 112 located on a side of the first display sub-region 111 facing away from the second display region 12. The transparent signal transmission line 16 includes a first transparent signal transmission line 161 and a second transparent signal transmission line 162. The pixel circuit 13 is electrically connected to the anode 1411 of the light-emitting element 141 in the first display sub-region 111 via the first transparent signal transmission line 161. The pixel circuit 13 is electrically connected to the anode 1411 of the light-emitting element 141 in the second display sub-region 112 via the second transparent signal transmission line 162 and the compensation structure 15. The anode 1411 of the light-emitting element 141 in the first display sub-region 111 at least partially overlaps the compensation structure 15 in the first direction (the direction X shown in the figure).

In general, a receiving position for receiving the display signal in the anode is generally located near the edge of the anode, and thus in a case where the compensation structure transmits the display signal to the anode located directly above the compensation structure, the length or area of the compensation structure located on the transmission path of the display signal is limited. Therefore, the compensation structure reduces the loss of the display signal during the transmission of the display signal, and the extent of the reduction is limited, so that in the embodiment of the present disclosure the compensation structure is set to transmit the display signal to the anode that is not directly above the compensation structure.

For example, as shown in FIGS. 8 and 9, the transparent signal line 16 includes the first transparent signal line 161 and the second transparent signal line 162, and the display signal provided by the pixel circuit 13 is transmitted via the first transparent signal line 161 to the anode 1411 of the first light-emitting element 141 in the first display sub-region 111, that is, the compensation structure 15 in the first display sub-region 111 does not participate in the transmission of the display signal to the first light-emitting element in the first display sub-region 111, thereby ensuring that the manner in which the display signal is transmitted to the first light-emitting element 141 in the first display sub-region 111 is simple. For example, the pixel circuit 13 is electrically connected to the anode 1411 of the light-emitting element 141 in the second display sub-region 112 via the second transparent signal transmission line 162 and the compensation structure 15, that is, the compensation structure in the first display sub-region 111 participates in the transmission of the display signal to the first light-emitting element in the second display sub-region 112, that is, the compensation structure 15 transmits the display signal to the anode 1411 that is not directly above the compensation structure 15. As shown in FIGS. 8 and 9, the pixel circuit 13 is electrically connected to the anode 1411 of the light-emitting element 141 in the second display sub-region 112 via the second transparent signal transmission line 162 and the compensation structure 15, and the majority of the compensation structure 15 is located on the transmission path of the display signal. The compensation structure 15 may include metal material, the resistivity of the metal material is relatively small, and thus compared with the transmission of the display signal by only using the transparent signal transmission line 16, the transmission of the display signal by using the transparent signal transmission line 16 and the compensation structure 15 can ensure that the loss of the display signal is relatively small and that the display panel has a good display effect.

For example, the anode 1411 of the light-emitting element 141 in the first display sub-region 111 at least partially overlaps the compensation structure 15 in the first direction (the direction X shown in the figure), so that the compensation structure 15 in the first display sub-region 111 can also give consideration to the function of heat dissipation of the first display sub-region 111, thereby ensuring that the first display sub-region 111 has a good heat dissipation effect.

In summary, the above embodiment describes how the compensation structure transmits the display signal, that is, the compensation structure may transmit the display signal to the anode located directly above the compensation structure, and the compensation structure may also transmit the display signal to the anode not located directly above the compensation structure. Since the compensation structure may include metal material, the transmission of the display signal by using the transparent signal transmission line and the compensation structure can ensure that the loss of the display signal is relatively small and that the display panel has a good display effect.

It is to be noted that FIGS. 5 and 8 only describe an example in which one pixel circuit drives one light-emitting element. It is also to be understood that one pixel driving circuit may also drive at least two light-emitting elements in technical solutions of the embodiment of the present disclosure, which are not limited in the embodiment of the present disclosure.

Based on the above-mentioned embodiment, continuing to refer to FIGS. 5 and 8, the second display region 12 includes a third display sub-region 121 and a fourth display sub-region 122. The third display sub-region 121 surrounds at least part of the first display region 11, and the fourth display sub-region 122 surrounds at least part of the third display sub-region 121. The third display sub-region 121 includes multiple second light-emitting elements 142, and the fourth display sub-region 122 includes multiple third light-emitting elements 143. The pixel circuit 13 includes a first pixel circuit 131 and a second pixel circuit 132, the first pixel circuit 131 is disposed in the third display sub-region 121, and the second pixel circuit 132 is disposed in the fourth display sub-region 122. The first pixel circuit 131 is configured to drive a second light-emitting element 142 and a first light-emitting element 141, and the second pixel circuit 132 is configured to drive a third light-emitting element 143.

For example, as shown in FIGS. 5 and 8, the second display region 12 includes the third display sub-region 121 and the fourth display sub-region 122. The third display sub-region 121 surrounds at least part of the first display region 11, and the fourth display sub-region 122 surrounds at least part of the third display sub-region 121. The third display sub-region 121 can be understood as a transition display region and the fourth display sub-region 122 can be understood as a normal display region. In general, the first display region 11 may serve as a transparent display region, that is, some photosensitive sensors, such as a camera, may be disposed in an area corresponding to the first display region 11, correspondingly. Therefore, the first display region 11 needs to have good light transmission, and for example, the distribution density of pixel circuits in the first display region may be set to be relatively small. The transition display region is a transition region between the normal display region and the transparent display region.

The distribution density of pixel circuits in the transition display region may be between the distribution density of pixel circuits in the first display region and the distribution density of pixel circuits in the normal display region, that is, the distribution density of pixel circuits in the third display sub-region 121 is greater than the distribution density of pixel circuits in the first display region 11 and smaller than the distribution density of pixel circuits in the fourth display sub-region 122; and/or the distribution density of light-emitting elements in the transition display region may be between the distribution density of light-emitting elements in the transparent display region and the distribution density of light-emitting elements in the normal display region, that is, the distribution density of light-emitting elements in the third display sub-region 121 is greater than the distribution density of light-emitting elements in the first display region 11 and smaller than the distribution density of light-emitting elements in the fourth display sub-region 122. This manner can ensure a normal transition of the display effect between the normal display region and the transparent display region, and apparent display differences can be avoided. FIGS. 5 and 8 describe an example in which the distribution density of pixel circuits in the third display sub-region 121 is greater than the distribution density of pixel circuits in the first display region 11 and equal to the distribution density of pixel circuits in the fourth display sub-region 122, and the distribution density of light-emitting elements in the third display sub-region 121 is greater than the distribution density of light-emitting elements in the first display region 11 and smaller than the distribution density of light-emitting elements in the fourth display sub-region 122.

For example, the first pixel circuit 131 is configured to drive the second light-emitting element 142 and the first light-emitting element 141, and this manner can be understood that as shown in FIGS. 5 and 8, a part of first pixel circuits 131 are configured to drive first light-emitting elements 141 and the remaining part of first pixel circuits 131 are configured to drive second light-emitting elements 142. Alternatively, the first pixel circuit 131 is configured to drive the second light-emitting element 142 and the first light-emitting element 141 (not shown in the figure) at the same time, that is, a scheme is employed in which one first pixel circuit 131 drives multiple light-emitting elements. The embodiment of the present disclosure does not limit the correspondence between a pixel circuit and a light-emitting element. All the pixel circuits are disposed in the second display region instead of a non-display region, ensuring that the second display region has a good heat dissipation effect and the first display region is normally displayed. At the same time, the screen-to-body ratio of the display panel can be guaranteed to be relatively large, and a good display can be ensured. The compensation structure is added in the first display area, the compensation structure compensates for the heat dissipation capacity of the first display region, and a good heat dissipation effect and a good light-transmissive effect of the first display region are ensured.

In summary, the above-mentioned embodiments are described by using pixel circuits disposed in the second display region as an example. It is to be understood that the pixel circuits may be arranged in other manners, and two optional arrangements are described below as examples.

Figure 10:
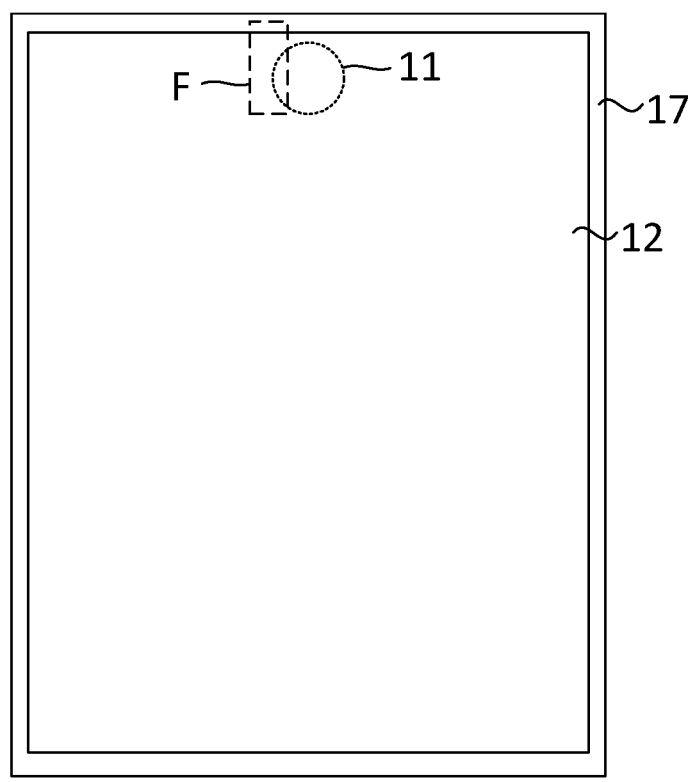
FIG. 10 is another structure diagram of a display panel according to an embodiment of the present disclosure.
Figure 11:
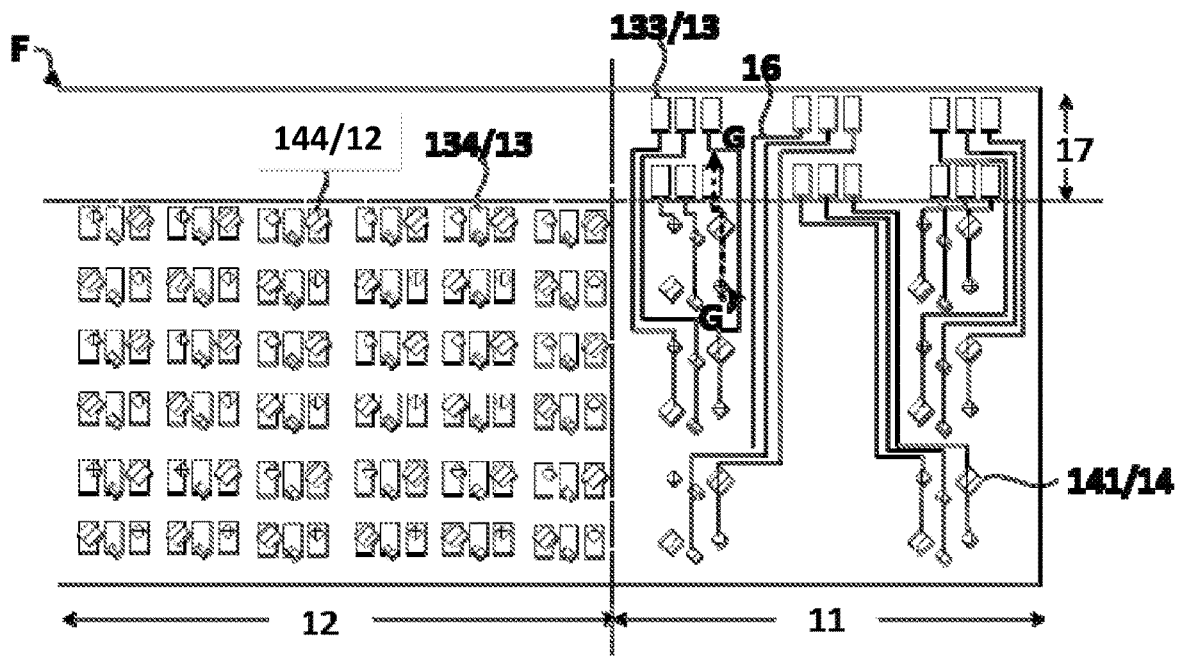
FIG. 11 is an enlarged structure diagram of area F of FIG. 10.
Figure 12:
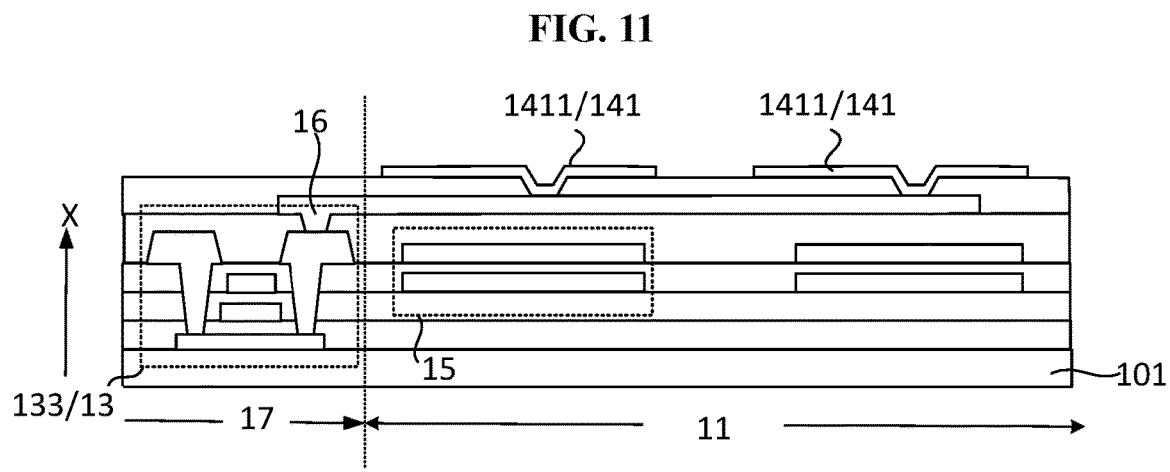
FIG. 12 is a section view taken along direction G-G' of FIG. 11.

In an optional embodiment, FIG. 10 is another structure diagram of a display panel according to an embodiment of the present disclosure, FIG. 11 is an enlarged structure diagram of area F of FIG. 10, and FIG. 12 is a section view taken along direction G-G' of FIG. 11. As shown in FIGS. 10, 11 and 12, the display panel 10 provided in the embodiment of the present disclosure further includes a non-display region 17, and the non-display region 17 surrounds at least part of the second display region 12. The second display region 12 includes multiple fourth light-emitting elements 144. Pixel circuits 13 include a third pixel circuit 133 and a fourth pixel circuit 134, the third pixel circuit 133 is configured to drive a first light-emitting element 141 to emit light, and the fourth pixel circuit 134 is configured to drive a fourth light-emitting element 144 to emit light. At least part of the third pixel circuit 133 is disposed in the non-display region 17, and the fourth pixel circuit 134 is disposed in the second display region 12.

For example, part of pixel circuits may be disposed in the non-display region in the embodiment of the present disclosure, which is different from the above-mentioned embodiment in which all the pixel circuits are disposed in the display region. For example, as shown in FIGS. 11 and 12, pixel circuits 13 may include the third pixel circuit 133 and the fourth pixel circuit 134. At least part of third pixel circuits 133 are disposed in the non-display region 17, and the third pixel circuits 133 are configured to drive first light-emitting elements 141, ensuring that light-emitting elements in the first display region 11 and the second display region 12 can be driven respectively, preventing the fourth pixel circuit 134 located in the second display region 12 from driving the first light-emitting element 141 and the fourth light-emitting element 144 simultaneously to affect the display resolution.

It is to be noted that FIGS. 11 and 12 describe but are not limited to an example in which one third pixel circuit 133 drives two first light-emitting elements 141 at the same time. It is to be understood that a third pixel circuit 133 and a first light-emitting element 141 may be arranged in a one-to-one correspondence or a one-to-many relationship, which is not limited in the embodiment of the present disclosure.

Figure 13:
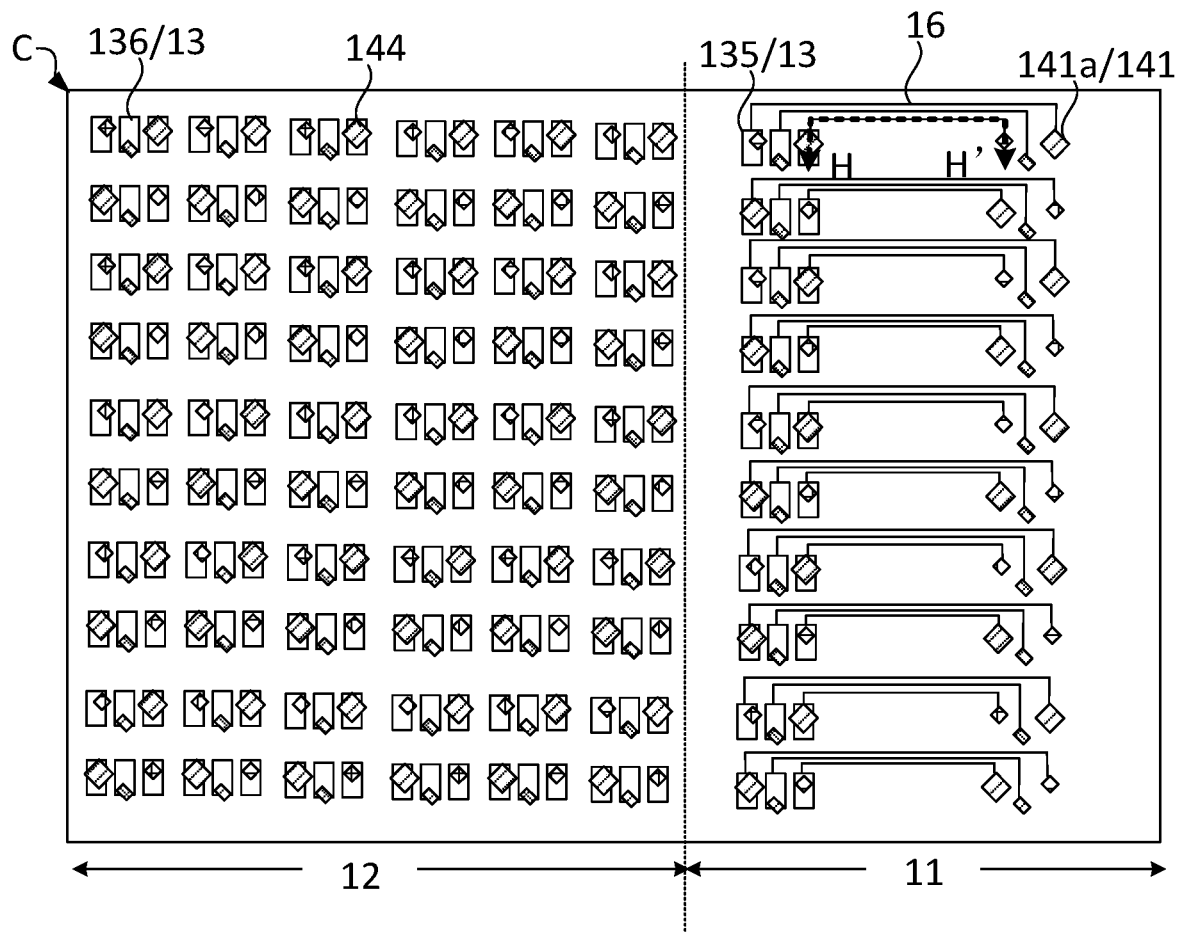
FIG. 13 is another enlarged structure diagram of area C of FIG. 4.
Figure 14:
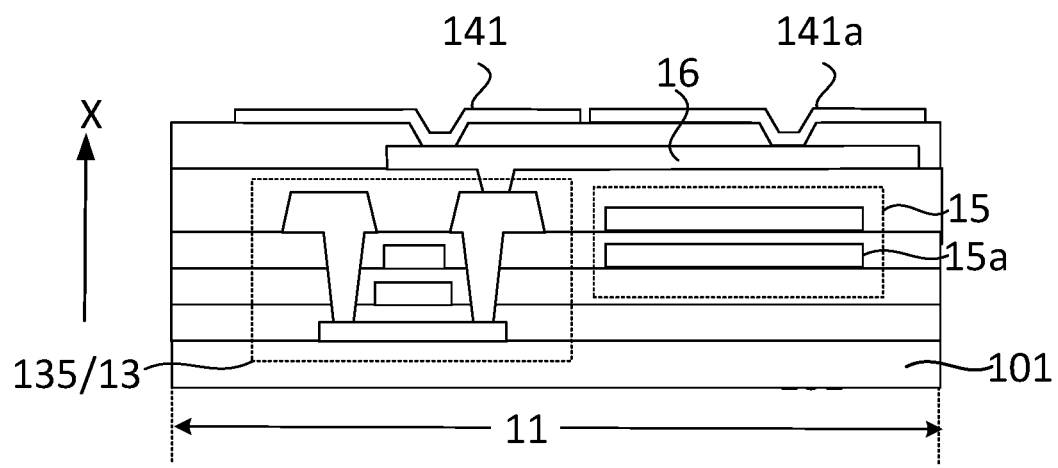
FIG. 14 is a section view taken along direction H-H' of FIG. 13.

In an optional embodiment, FIG. 13 is another enlarged structure diagram of area C of FIG. 1, and FIG. 14 is a section view taken along direction H-H' of FIG. 13. As shown in FIGS. 13 and 14, pixel circuits 13 include a fifth pixel circuit 135 and a sixth pixel circuit 136, the fifth pixel circuit 135 is disposed in the first display region 11, and the sixth pixel circuit 136 is disposed in the second display region 12. The second display region 12 further includes multiple fourth light-emitting elements 144. The fifth pixel circuit 135 is configured to drive at least two first light-emitting elements 141, and the sixth pixel circuit 136 is configured to drive a fourth light-emitting element 144.

For example, part of pixel circuits may be disposed in the first display region in the embodiment of the present disclosure, which is different from the above-mentioned embodiment in which all the pixel circuits are disposed in the second display region or part of pixel circuits are disposed in the non-display region. For example, as shown in FIGS. 13 and 14, pixel circuits 13 may include the fifth pixel circuit 135 and the sixth pixel circuit 136. The fifth pixel circuit 135 is disposed in the first display region 11 and is configured to drive the first light-emitting element 141 in the first display region 1 to emit light, and the sixth pixel circuit 136 is disposed in the second display region 12 and is configured to drive the fourth light-emitting element 144 in the second display region 12 to emit light, that is, all the pixel circuits are arranged to drive light-emitting elements in the same area to emit light, so that there is no need to arrange the transparent signal line with a long wire length, thus achieving electrical connection between a pixel circuit and a light-emitting element, ensuring that the correspondence between the pixel circuit and the light-emitting element is simple and the connection related to the correspondence is simple.

It is also to be noted that FIGS. 13 and 14 describe but are not limited to an example in which one fifth pixel circuit 135 drives two first light-emitting elements 141 at the same time. It is to be understood that the fifth pixel circuit 135 and the first light-emitting element 141 may be arranged in other correspondences, which are not limited in the embodiment of the present disclosure, so long as it is ensured that the first display region 11 has a good light transmitting effect.

Continuing to refer to FIG. 14, the first light-emitting element 141 includes a first light-emitting sub-element 141a. In the first direction (the direction X shown in the figure), the first light-emitting sub-element 141a does not overlap the fifth pixel circuit 135, and the first light-emitting sub-element 141a does not overlap a connection line (not shown in the figure) between two adjacent fifth pixel circuits. In the first direction, an anode of the first light-emitting sub-element 141a at least partially overlaps the compensation structure 15.

Continuing to refer to FIG. 14, in a case where the fifth pixel circuit 135 is provided in the first display region 11, in the first direction (the direction X shown in the figure), part of first light-emitting elements 141 at least partially overlap the fifth pixel circuit 135, and the remaining part of first light-emitting elements 141 at least partially overlap the compensation structure 15, that is, the vertical projection of part of first light-emitting elements 141 on a plane in which a substrate is located at least partially overlaps the vertical projection of the fifth pixel circuit 135 on the plane in which the substrate is located. Heat dissipation is achieved by using the fifth pixel circuit 135, the vertical projection of the remaining part of first light-emitting elements 141 on the plane in which the substrate is located at least partially overlaps the vertical projection of the compensation structure 15 on the plane in which the substrate is located, and the compensation for heat dissipation is achieved by using the compensation structure 15, thus ensuring that the first display region 11 has a good heat dissipation effect. The heat dissipation of different first light-emitting elements 141 is balanced to ensure that the display uniformity of the first display region 11 is good.

Since a connection line is disposed between two adjacent fifth pixel circuits 135, such as a scan signal line, data signal line or voltage signal line which is connected to two adjacent fifth pixel circuits 135 separately, the first light-emitting sub-element 141a does not overlap a connection line between two adjacent fifth pixel circuits in the first direction (the direction X shown in the figure), that is, no metal wire is provided below the first light-emitting sub-element 141a. In this manner, an anode of the first light-emitting sub-element 141a at least partially overlaps the compensation structure 15 in the first direction, and the compensation structure 15 compensates for heat dissipation of the first sub-light-emitting element 141a, thus ensuring that the first light-emitting sub-element 141a has a good heat dissipation effect.

In summary, the above-mentioned embodiment describes the arrangement of the pixel circuit and the compensation structure in multiple different implementations, and next, the arrangement of the compensation structure is described in other aspects.

Continuing to refer to FIG. 6, in the first direction (the direction X shown in the figure), the anode 1411 covers the compensation structure 15, that is, the vertical projection of the anode 1411 on the plane in which the substrate 101 is located covers the vertical projection of the compensation structure 15 on the plane in which the substrate 101, thus ensuring that the compensation structure 15 does not affect the light transmitting effect of the first display region 11 at all and that the light transmitting effect of the first display region 11 is good.

Based on the above-mentioned embodiment, a compensation film in the compensation structure may include a metal compensation film. Since the heat dissipation effect of a metal film is good, the compensation film is set to include the metal compensation film to ensure that the compensation structure can sufficiently perform the heat dissipation on the first display region to ensure that the heat dissipation effect of the first display region is good.

Based on this, the pixel circuit may include at least one metal layer. The metal compensation film in the compensation structure and the metal layer in the pixel circuit may be disposed in the same layer. The same material is used in the same process to ensure that the compensation structure is set up in a simple way, the preparation technique is simple, and the film structure of the display panel is simple.

The film structure of the compensation structure is described below.

Figure 15:
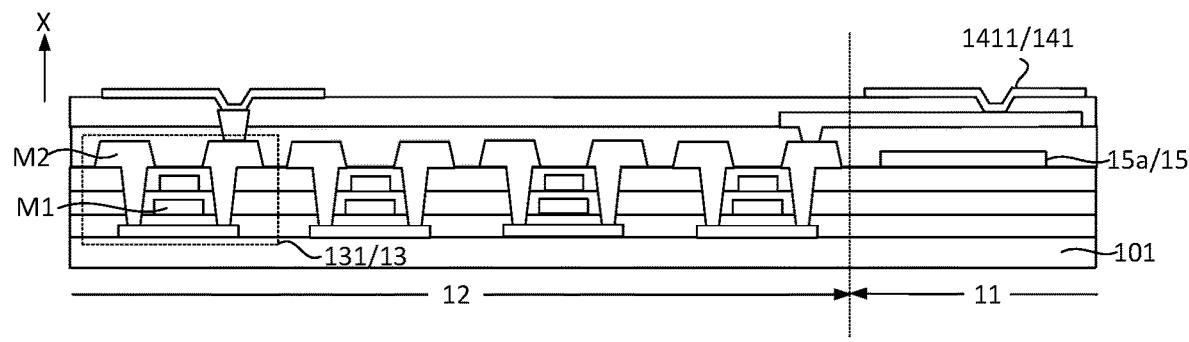
FIG. 15 is another section view taken along direction D-D' of FIG. 5.

FIG. 15 is another section view taken along direction D-D' of FIG. 5. As shown in FIG. 15, the pixel circuit 13 includes at least a first metal layer M1 and a second metal layer M2, and the second metal layer M2 is located on a side of the first metal layer M1 facing away from the substrate 101. The metal compensation film and the second metal layer M2 are disposed in the same layer.

For example, the pixel circuit 13 may include multiple metal films, such as a gate metal layer and a source-drain metal layer. A gate in the pixel circuit is provided in the gate metal layer, and a source and a drain in the pixel circuit are provided in the source-drain metal layer. In the embodiment of the present disclosure, the first metal layer M1 may serve as a gate metal layer, and the second metal layer M2 may serve as a source-drain metal layer. The metal compensation film in the compensation structure 15 and the second metal layer M2 are disposed in the same layer, and for example, the same material may be used in the same process to ensure that the compensation structure 15 is set up in a simple way, the preparation technique is simple, and the film structure of the display panel is simple.

Referring to FIG. 15, the second metal layer M2 is a metal layer located closer to a side of the anode of the light-emitting element, and the metal compensation film in the compensation structure 15 and the second metal layer M2 are disposed in the same layer, ensuring that the distance between the metal compensation film and the anode 1411 in the first light-emitting element 141 is relatively short, ensuring that the metal compensation film can play a good heat dissipation compensation effect on the heat generated during the light-emitting process of the anode, and ensuring that the heat dissipation effect of the first light-emitting element and the first display region is good.

Figure 16:
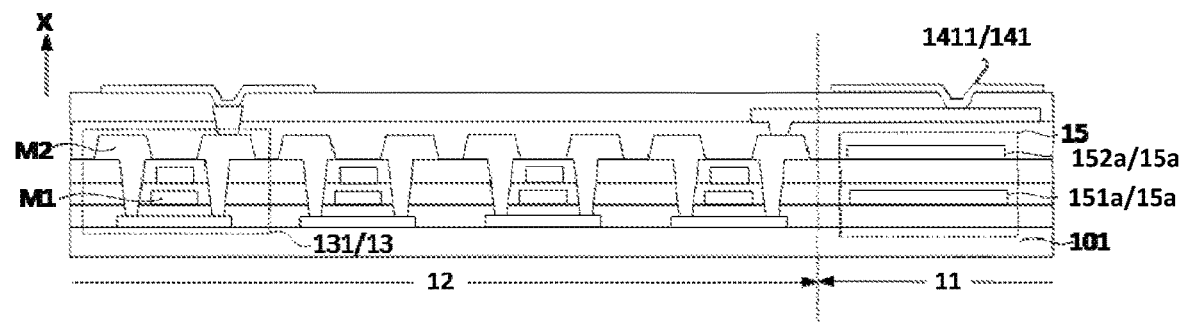
FIG. 16 is another section view taken along direction D-D' of FIG. 5.

FIG. 16 is another section view taken along direction D-D' of FIG. 5. As shown in FIG. 16, at least one layer of compensation film 15a includes a first compensation film 151a and a second compensation film 152a, and the second compensation film 152a is located on a side of the first compensation film 151a facing away from the substrate 101. The pixel circuit 13 includes at least the first metal layer M1 and the second metal layer M2, and the second metal layer M2 is located on a side of the first metal layer M1 facing away from the substrate 101. The first compensation film 151a and the first metal layer M1 are disposed in the same layer, and the second compensation film 152a and the second metal layer M2 are disposed in the same layer.

For example, the compensation structure 15 may include multiple compensation films 15a. As shown in FIG. 16, compensation films 15a include the first compensation film 151a and the second compensation film 152a which are stacked in the first direction (the direction X shown in the figure), and the compensation films 15a in the multi-layer stack compensate for heat dissipation of the first display region 11 simultaneously, ensuring a good heat dissipation compensation effect.

For example, the pixel circuit 13 may include multiple metal films, such as a gate metal layer and a source-drain metal layer. A gate in the pixel circuit is provided in the gate metal layer, and a source and a drain in the pixel circuit are provided in the source-drain metal layer. In the embodiment of the present disclosure, the first metal layer M1 may serve as a gate metal layer, and the second metal layer M2 may serve as a source-drain metal layer. The first compensation film 151a in the compensation structure 15 and the first metal layer M1 are disposed in the same layer, and the second compensation film 152a and the second metal layer M2 are disposed in the same layer, thereby ensuring that films in the compensation structure 15 and corresponding films in the pixel circuit are prepared by using the same material in the same technique, ensuring that the compensation structure 15 is set up in a simple way, the preparation technique is simple, and the film structure of the display panel is simple.

Figure 17:
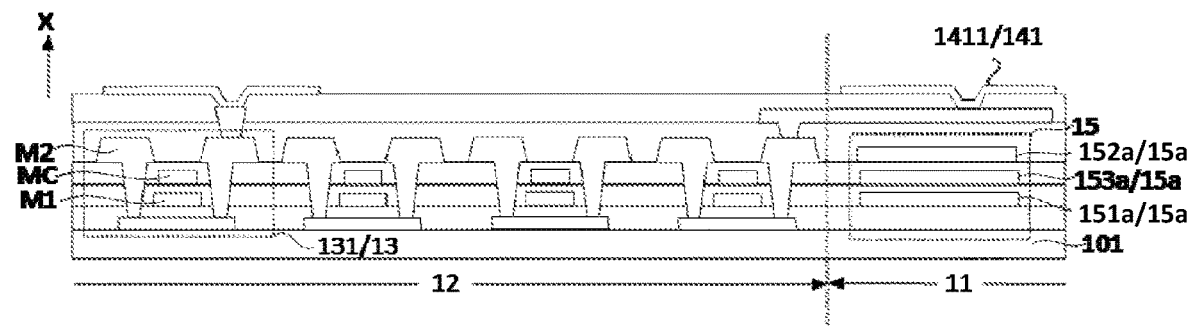
FIG. 17 is another section view taken along direction D-D' of FIG. 5.

FIG. 17 is another section view taken along direction D-D' of FIG. 5. As shown in FIG. 17, at least one layer of compensation film 15a further includes a third compensation film 153a, and the third compensation film 153a is disposed between the first compensation film 151a and the second compensation film 152a. The pixel circuit 13 further includes a capacitor substrate layer MC, and the capacitor substrate layer MC is disposed between the first metal layer M1 and the second metal layer M2. The third compensation film 153a and the capacitor substrate layer MC are disposed in the same layer.

For example, the compensation structure 15 may include multiple compensation films 15a. For example, as shown in FIG. 17, the compensation films 15a may include the third compensation film 153a, and the first compensation film 151a, the second compensation film 152a, and the third compensation film 153a are at least partially overlapped in the first direction (the direction X shown in the figure). The compensation films 15a in the multi-layer stack compensate for heat dissipation of the first display region 11 simultaneously, ensuring a good heat dissipation compensation effect.

For example, the pixel circuit 13 may include multiple metal films. For example, as shown in FIG. 17, the pixel circuit 13 may include the capacitor substrate layer MC, and the capacitor substrate layer MC is located between the first metal layer M1 and the second metal layer M2 in the first direction (the direction X shown in the figure). One substrate among storage capacitors in the pixel circuit is arranged in the capacitor substrate layer MC, and one capacitor substrate in the capacitor substrate layer MC and the other capacitor substrate in the first metal layer M1 form a storage capacitor. For example. The storage capacitor is configured to maintain a gate potential of a drive transistor in a pixel circuit. The third compensation film 153a in the compensation structure 15 and the capacitor substrate layer MC are disposed in the same layer, and the same material is used in the same process to ensure that the compensation structure 15 is set up in a simple way, the preparation technique is simple, and the film structure of the display panel is simple.

Figure 18:
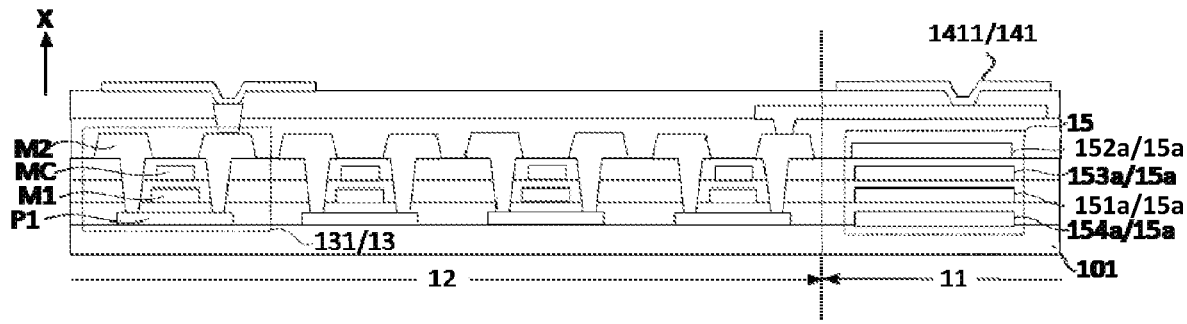
FIG. 18 is another section view taken along direction D-D' of FIG. 5.

FIG. 18 is another section view taken along direction D-D' of FIG. 5. As shown in FIG. 18, at least one layer of compensation film 15a further includes a fourth compensation film 154a located on a side of the first compensation film 151a closer to the substrate 101. The pixel circuit 13 further includes an active layer P1 located on a side of the first metal layer M1 closer to the substrate, and the fourth compensation film 154a and the active layer P1 are disposed in the same layer.

For example, the compensation structure 15 may include multiple compensation films 15a. For example, as shown in FIG. 18, the compensation films 15a may include the fourth compensation film 154a, and the first compensation film 151a, the second compensation film 152a, the third compensation film 153a, and the fourth compensation film 154a are at least partially overlapped in the first direction (the direction X shown in the figure). The compensation films 15a in the multi-layer stack compensate for heat dissipation of the first display region 11 simultaneously, ensuring a good heat dissipation compensation effect.

For example, the pixel circuit 13 may include multiple metal films. For example, as shown in FIG. 18, the pixel circuit 13 may include the active layer P1, and the active layer P1 is located on the side of the first metal layer M1 closer to the substrate 101 in the first direction (the direction X shown in the figure). The active layer P1 includes an active layer in the pixel circuit. For example, the active layer P1 may be made of a polysilicon material. Since the polysilicon material has a good heat dissipation capacity, the fourth compensation film 154a in the compensation structure 15 and the active layer P1 are disposed in the same layer, and the same material is used in the same process. In this manner, it is ensured that the compensation structure 15 is set up in a simple way and the preparation technique is simple. Based on the simple film structure of the display panel, the heat dissipation capacity of the compensation structure 15 can also be ensured to be strong.

Figure 19:
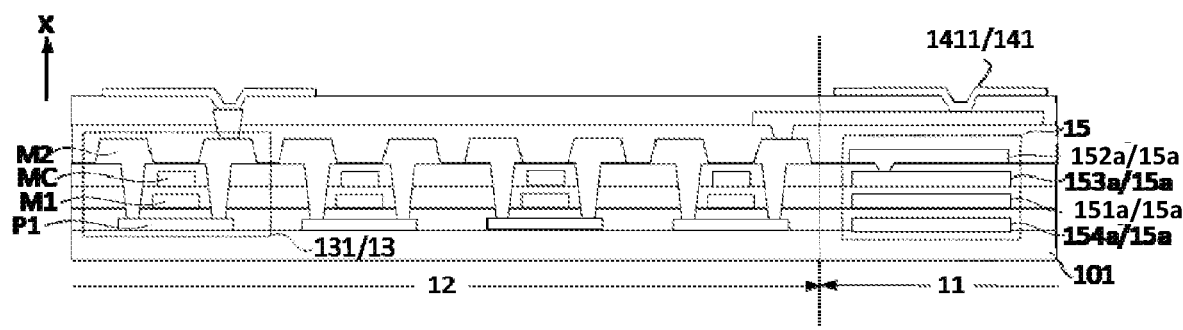
FIG. 19 is another section view taken along direction D-D' of FIG. 5.

FIG. 19 is another section view taken along direction D-D' of FIG. 5. As shown in FIG. 19, the second compensation film 152a is electrically connected to the first compensation film 151a through a via; and/or the second compensation film 152a is electrically connected to the third compensation film 153a through a via; and/or the second compensation film 152a is electrically connected to the fourth compensation film 154a through a via.

FIG. 19 only describes an example in which the second compensation film 152a is electrically connected to the third compensation film 153a through a via. At least two compensation films are electrically connected through a via. Thus it is ensured that the heat generated by the first display region can be transferred in the first direction (the direction X shown in the figure), the heat dissipation capability and uniformity of heat dissipation of the compensation structure are improved, and it is ensured that the first display region has a good heat dissipation effect.

For example, a 7T1C pixel circuit is taken as an example. In the pixel circuit, there is a connection via between the second metal layer M2 and the first metal layer M1. For example, the drain of an initialization transistor is electrically connected to the gate of a drive transistor through the connection via between the second metal layer M2 and the first metal layer M1. Meanwhile, there is a connection via between the second metal layer M2 and the capacitor substrate layer MC. For example, the drain of an initialization transistor is electrically connected to a storage capacitor through the connection via between the second metal layer M2 and the capacitor substrate layer MC. Meanwhile, there is a connection via between the second metal layer M2 and the active layer P1. For example, the source and the drain of an initialization transistor are electrically connected to the active layer through the connection via between the second metal layer M2 and the active layer P1. Therefore, the second compensation film 152a is electrically connected to the first compensation film 151a through a via; and/or the second compensation film 152a is electrically connected to the third compensation film 153a through a via; and/or the second compensation film 151a is electrically connected to the fourth compensation film 154a through a via. Connection vias between different films in the pixel circuit can be prepared simultaneously, ensuring a simple process in which different compensation films in the compensation structure are connected through vias.

In summary, the above-described embodiment describes various optional implementations of the arrangement of films in the compensation structure. Hereinafter, the arrangement of the compensation structure is described with reference to the relationship between the compensation structure and a pixel opening.

Figure 20:
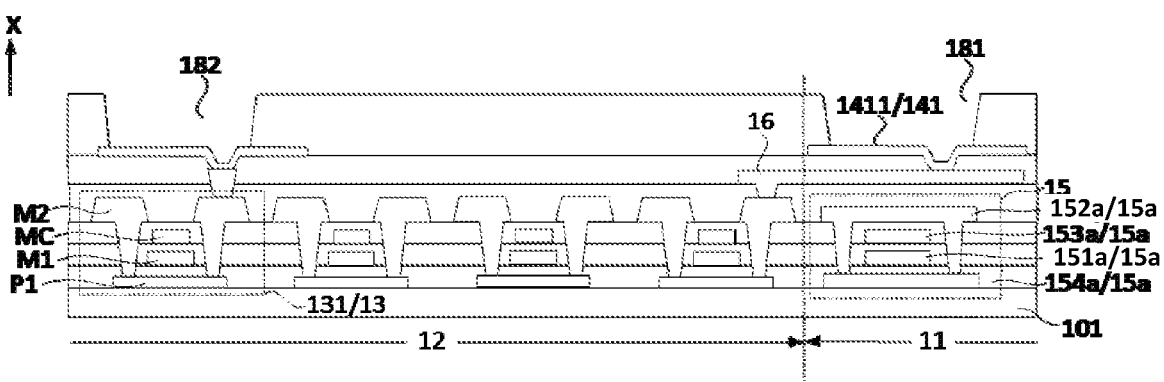
FIG. 20 is another section view taken along direction D-D' of FIG. 5.

FIG. 20 is another section view taken along direction D-D' of FIG. 5. As shown in FIG. 20, the first display region 11 includes a first display opening region 181, and the first display opening region 181 at least partially overlaps the compensation structure 15 in the first direction (the direction X shown in the figure).

As shown in FIG. 20, the first display region 11 includes the first display opening region 181, and the second display region 12 includes a second display opening region 182. Light-emitting material in the light-emitting element may be disposed in a corresponding display opening region, so that the first display opening region 181 corresponds to the light-emitting region of the light-emitting element in the first display region 11 and the second display opening region 182 corresponds to the light-emitting region of the light-emitting element in the second display region 12. A corresponding pixel circuit 13 is provided below the second display opening area 182, and no pixel circuit is provided below the first display opening area 181. Therefore, there is a difference between the film structure below the first display opening area 181 and the film structure below the second display region 182. At a determined observation position, there is an optical path difference between the light emitted from the light-emitting area corresponding to the first display opening area 181 and the light emitted from the light-emitting area corresponding to the second display opening area 182, thereby causing a display difference. Therefore, the embodiment of the present disclosure provides an inventive arrangement. In the arrangement, the first display opening region 181 at least partially overlaps the compensation structure 15 in the first direction (the direction X shown in the figure), and the compensation structure 15 compensates for the difference between the film structure below the first display opening region 181 and the film structure below the second display region 182, thus reducing or eliminating the optical path difference between the light emitted from the light-emitting area corresponding to the first display opening area 181 and the light emitted from the light-emitting area corresponding to the second display opening area 182, reducing the display difference between the first display opening region 181 and the second display opening region 182, and improving the display effect of the display panel.

Optionally, continuing to refer to FIG. 20, the second display region 12 includes the second display opening region 182. In the first direction (the direction X shown in the figure), a relative positional relationship between the first display opening region 181 and the compensation structure 15 is the same as a relative positional relationship between the second display opening region 182 and the pixel circuit 13.

For example, the relative positional relationship between the first display opening region 181 and the compensation structure 15 is the same as the relative positional relationship between the second display opening region 182 and the pixel circuit 13. It is to be understood that the overlapping between the first display opening region 181 and the compensation structure 15 in the first direction is the same as the overlapping between the second display opening region 182 and the pixel circuit 13 in the first direction. For example, in the first direction, the first display opening region 181 covers the compensation structure 15, and the second display opening region 182 covers the pixel circuit 13. The relative positional relationship ensures that the compensation structure 15 can reduce or eliminate the optical path difference between the light emitted from the light-emitting area corresponding to the first display opening area 181 and the light emitted from the light-emitting area corresponding to the second display opening area 182, that the display difference between the first display opening region 181 and the second display opening region 182 is reduced, and that the display effect of the display panel is improved.

Optionally, continuing to refer to FIG. 20, the film structure of the compensation structure 15 is the same as the film structure of the pixel circuit 13.

For example, the film structure of the compensation structure 15 is the same as the film structure of the pixel circuit 13. It is to be understood that the compensation structures 15 and pixel circuit 13 have the same number of films and corresponding films are disposed in the same layer. For example, the pixel circuit 13 includes the active layer P1, the first metal layer M1, the capacitor substrate layer MC, and the second metal layer M2 in sequence in the first direction. Correspondingly, the compensation structure 15 includes a fourth compensation layer 154a, a first compensation layer 151a, a third compensation layer 153a, and a second compensation layer 152a in sequence. In terms of the film structure, it is ensured that the compensation structure 15 can reduce or eliminate the optical path difference between the light emitted from the light-emitting area corresponding to the first display opening area 181 and the light emitted from the light-emitting area corresponding to the second display opening area 182, that the display difference between the first display opening region 181 and the second display opening region 182 is reduced, and that the display effect of the display panel is improved.

Based on the above-mentioned embodiment, the shape of the compensation structure may also correspond to the light-emitting color of the light-emitting element, which is described in detail below.

Figure 21:
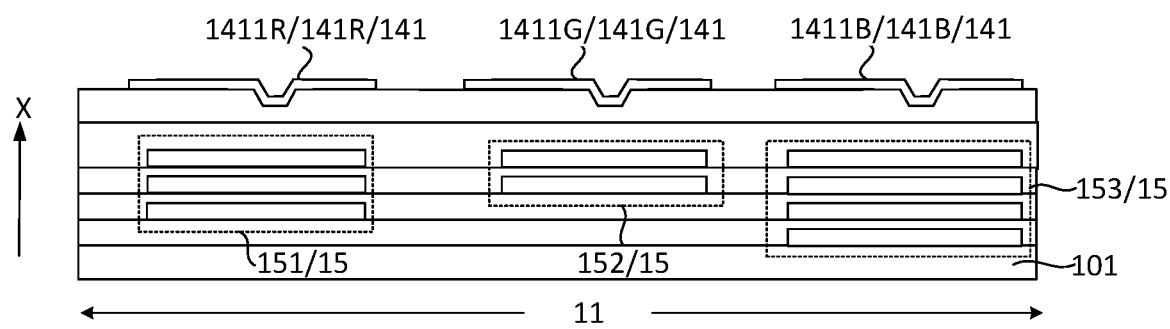
FIG. 21 is a section view taken along direction H-H' of FIG. 13.

FIG. 21 is a section view taken along direction I-I' of FIG. 13. As shown in FIG. 21, the first light-emitting element includes a first red light-emitting element 141R, a first green light-emitting element 141G, and a first blue light-emitting element 141B. The first red light-emitting element 141R includes a first sub-anode 1411R, the first green light-emitting element 141G includes a second sub-anode 1411G, and the first blue light-emitting element 141B includes a third sub-anode 1411B. The compensation structure 15 includes a first compensation structure 151, a second compensation structure 152, and a third compensation structure 153. In the first direction (the direction X shown in the figure), the first sub-anode 1411R at least partially overlaps the first compensation structure 151, the second sub-anode 1411G at least partially overlaps the second compensation structure 152, and the third sub-anode 1411B at least partially overlaps the third compensation structure 153. The sum of the surface area of the third compensation structure 153 is greater than the sum of the surface area of the first compensation structure 151, and the sum of the surface area of the first compensation structure 151 is greater than the sum of the surface area of the second compensation structure 152.

For example, in the first direction (the direction X shown in the figure), the first sub-anode 1411R at least partially overlaps the first compensation structure 151, the second sub-anode 1411G at least partially overlaps the second compensation structure 152, and the third sub-anode 1411B at least partially overlaps the third compensation structure 153, that is, the vertical projection of the first sub-anode 1411R on the plane in which the substrate 101 is located at least partially overlaps the vertical projection of the first compensation structure 151 on the plane in which the substrate 101 is located, the vertical projection of the second sub-anode 1411G on the plane in which the substrate 101 is located at least partially overlaps the vertical projection of the second compensation structure 152 on the plane in which the substrate 101 is located, and the vertical projection of the third sub-anode 1411B on the plane in which the substrate 101 is located at least partially overlaps the vertical projection of the third compensation structure 153 on the plane in which the substrate 101 is located. In this manner, the first compensation structure 151 compensates for heat dissipation of the first sub-anode 1411R, the second compensation structure 152 compensates for heat dissipation of the second sub-anode 1411G, and the third compensation structure 153 compensates for heat dissipation of the third sub-anode 1411B, thereby ensuring that the first sub-anode 1411R, the second sub-anode 1411G and the third sub-anode 1411B all can acquire good compensation for heat dissipation, ensuring that the first display region 11 has a good heat dissipation effect.

For example, in the display process of the display panel, the heat generated by a blue light-emitting element is the most, the heat generated by a red light-emitting element is the second most, and the heat generated by a green light-emitting element is the least. Thus, the sum of the surface area of the third compensation structure 153 corresponding to the first blue light-emitting element 141B may be set to be the largest, that is, the surface area that is able to dissipate heat in the third compensation structure 153 is the largest, ensuring that the third compensation structure 153 has the best heat dissipation effect. The sum of the surface area of the first compensation structure 151 is set to be the second largest, and the sum of the surface area of the second compensation structure 152 is the least. In this manner, the sum of the surface area of compensation structures 15 is differentially arranged according to the heat generated by the light-emitting element corresponding to the compensation structures 15, thereby ensuring that different light-emitting elements correspond to their matching compensation structures respectively, ensuring that the heat dissipation effect of the first display region is balanced, and ensuring that the light-emitting effect of light-emitting elements in the first display region is good.

For example, the sum of the surface area of the third compensation structure 153 is greater than the sum of the surface area of the first compensation structure 151, and the sum of the surface area of the first compensation structure 151 is greater than the sum of the surface area of the second compensation structure 152. The surface area of each compensation film in the third compensation structure 153 may be set to be relatively large, the surface area of each compensation film in the first compensation structure 151 may be set to be smaller than the surface area of each compensation film in the third compensation structure 153, and the surface area of each compensation film in the second compensation structure 152 may be set to be relatively small; or the number of compensation films in the third compensation structure 153 may be set to be relatively large, the number of compensation films in the first compensation structure 151 may be set to be smaller than the number of compensation films in the third compensation structure 153, and the number of compensation films in the second compensation structure 152 may be set to be relatively small; the integration of the adjustment of the surface area of each compensation film and the number of compensation films in the compensation structure may be employed, thereby ensuring that the sum of the surface area of the third compensation structure 153 is greater than the sum of the surface area of the first compensation structure 151 and the sum of the surface area of the first compensation structure 151 is greater than the sum of the surface area of the second compensation structure 152. These manners are not limited in the embodiment of the present disclosure. FIG. 21 only describes an example in which the number of compensation films in the third compensation structure 153 is relatively large, the number of compensation films in the first compensation structure 151 is smaller than the number of compensation films in the third compensation structure 153, and the number of compensation films in the second compensation structure 152 is relatively small.

Figure 22:
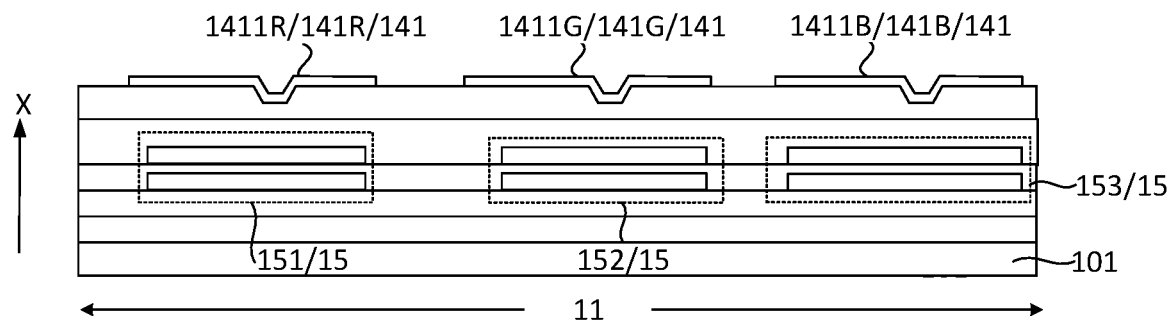
FIG. 22 is another section view taken along direction H-H' of FIG. 13.

FIG. 22 is another section view taken along direction I-I' of FIG. 13. As shown in FIG. 22, the first light-emitting element includes the first red light-emitting element 141R, the first green light-emitting element 141G, and the first blue light-emitting element 141B. The first red light-emitting element 141R includes the first sub-anode 1411R, the first green light-emitting element 141G includes the second sub-anode 1411G, and the first blue light-emitting element 141B includes the third sub-anode 1411B. The compensation structure 15 includes the first compensation structure 151, the second compensation structure 152, and the third compensation structure 153. In the first direction (the direction X shown in the figure), the first sub-anode 1411R at least partially overlaps the first compensation structure 151, the second sub-anode 1411G at least partially overlaps the second compensation structure 152, and the third sub-anode 1411B at least partially overlaps the third compensation structure 153. The structure of the first compensation structure 151 is the same as the structure of the second compensation structure 152 and the structure of the third compensation structure 153.

For example, in the first direction (the direction X shown in the figure), the first sub-anode 1411R at least partially overlaps the first compensation structure 151, the second sub-anode 1411G at least partially overlaps the second compensation structure 152, and the third sub-anode 1411B at least partially overlaps the third compensation structure 153, that is, the vertical projection of the first sub-anode 1411R on the plane in which the substrate 101 is located at least partially overlaps the vertical projection of the first compensation structure 151 on the plane in which the substrate 101 is located, the vertical projection of the second sub-anode 1411G on the plane in which the substrate 101 is located at least partially overlaps the vertical projection of the second compensation structure 152 on the plane in which the substrate 101 is located, and the vertical projection of the third sub-anode 1411B on the plane in which the substrate 101 is located at least partially overlaps the vertical projection of the third compensation structure 153 on the plane in which the substrate is located. In this manner, the first compensation structure 151 compensates for heat dissipation of the first sub-anode 1411R, the second compensation structure 152 compensates for heat dissipation of the second sub-anode 1411G, and the third compensation structure 153 compensates for heat dissipation of the third sub-anode 1411B, thereby ensuring that the first sub-anode 1411R, the second sub-anode 1411G and the third sub-anode 1411B all can acquire good compensation for heat dissipation, ensuring that the first display region 11 has a good heat dissipation effect.

The structure of the first compensation structure 151, the structure of the second compensation structure 152, and the structure of the third compensation structure 153 are set to be the same so that the arrangement of the first compensation structure 151, the second compensation structure 152, and the third compensation structure 153 can be ensured to be simple and the heat dissipation effects of different regions in the first display region 11 are balanced.

Figure 23:
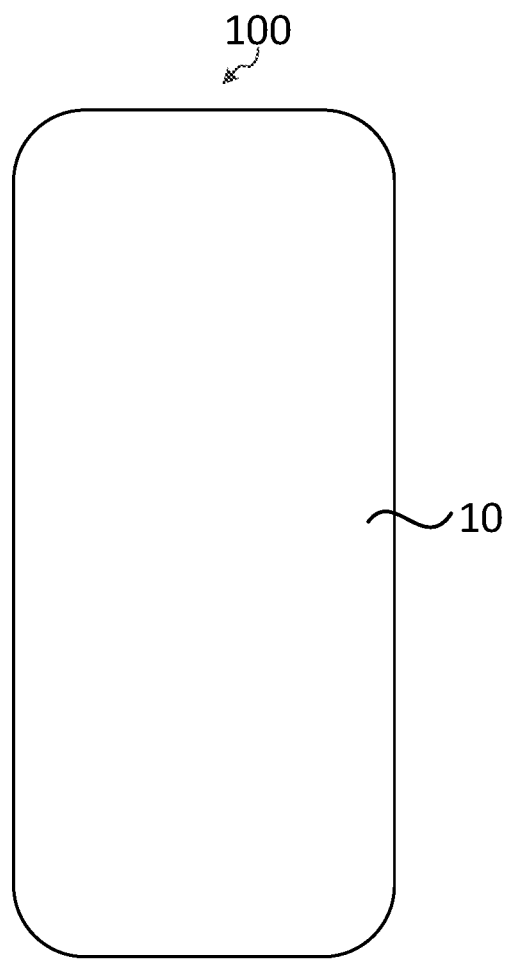
FIG. 23 is a structure diagram of a display device according to an embodiment of the present disclosure.

An embodiment of the present disclosure also provides a display device, and FIG. 23 is a structure diagram of a display device according to an embodiment of the present disclosure. As shown in FIG. 23, the display device 100 includes the display panel 10 described in any embodiment of the present disclosure, and structures which are the same as or correspond to the embodiments described above and the explanation of the term will not be repeated here. The display device 100 according to the embodiments of the present disclosure may be the phone shown in FIG. 23 or may be any electronic product with a display function, including but not limited to: a television, a notebook computer, a desktop display, a tablet computer, a digital camera, a smart bracelet, a pair of smart glasses, an in-vehicle display, medical equipment, industrial control equipment, and a touch interactive terminal, and this embodiment of the present disclosure is not particularly limited thereto.

Figure 24:
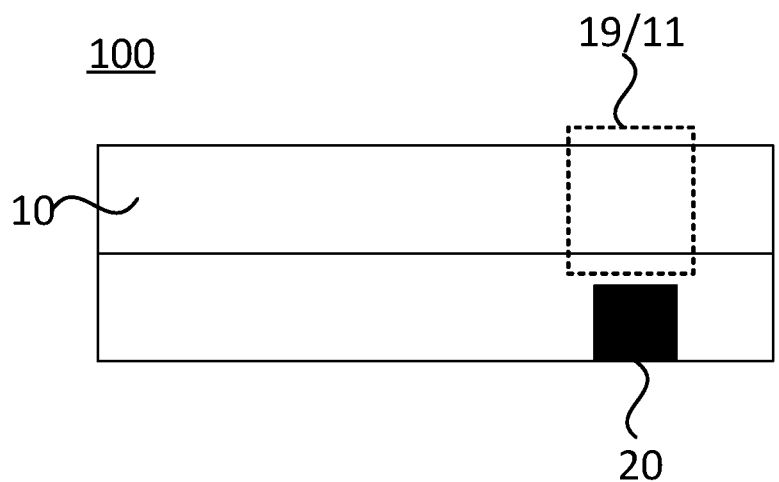
FIG. 24 is a sectional structure diagram of a display device according to an embodiment of the present disclosure.

FIG. 24 is a sectional structure diagram of a display device according to an embodiment of the present disclosure. As shown in FIGS. 23 and 24, optionally, the display device according to the embodiment of the present disclosure further includes a sensor 20. The display panel 10 further includes a sensor reservation area 19, and the sensor 20 is disposed in the sensor reservation area 19. The first display region 11 also serves as the sensor reservation area 19.

The sensor 20 may include any photosensor such as a camera, an infrared transducer, or the like. The sensor 20 is disposed to correspond to the first display region 11, and the distribution density of pixel circuits in the first display region is set to be smaller than the distribution density of pixel circuits in the second display region, thereby improving the light transmitting effect of the first display region, ensuring that the sensor 20 can receive light normally and work normally. The first display region includes the compensation structure, the compensation structure compensates for the heat dissipation problem caused by the smaller distribution density of pixel circuits in the first display region, and the heat dissipation capacity of the first display region is improved. In the direction perpendicular to the plane in which the substrate is located, the anode of the light-emitting element in the first display region at least partially overlaps the compensation structure, that is, the anode covers at least part of the compensation structure, to ensure that the setting of the compensation structure does not affect the light transmitting effect of the first display region and the light transmitting effect of the first display region is good.

What is claimed is:

1. A display panel, comprising a first display region and a second display region;
wherein the display panel further comprises pixel circuits, and the pixel circuits are configured to drive light-emitting elements to emit light; wherein a distribution density of the pixel circuits in the first display region is less than a distribution density of the pixel circuits in the second display region;
wherein the first display region comprises a compensation structure, and the compensation structure comprises at least one layer of compensation film; and
wherein the first display region further comprises a plurality of first light-emitting elements, and each of the plurality of first light-emitting elements comprises an anode; the anode at least partially overlaps the compensation structure in a first direction; and the display panel further comprises a substrate, and the first direction is perpendicular to a plane in which the substrate is located;
wherein the pixel circuits comprise fifth pixel circuits and sixth pixel circuits, the fifth pixel circuits are disposed in the first display region, and the sixth pixel circuits are disposed in the second display region;
the second display region further comprises a plurality of fourth light-emitting elements; and
a fifth pixel circuit of the fifth pixel circuits is configured to drive at least two of the plurality of first light-emitting elements, and a sixth pixel circuit of the sixth pixel circuits is configured to drive a fourth light-emitting element of the plurality of fourth light-emitting elements, and
wherein the plurality of first light-emitting elements comprises first light-emitting sub-elements; in the first direction, the first light-emitting sub-element does not overlap the fifth pixel circuit, and the first light-emitting sub-element does not overlap a connection line between two adjacent fifth pixel circuits of the fifth pixel circuits; and
in the first direction, an anode of the first light-emitting sub-element at least partially overlaps the compensation structure.

2. The display panel of claim 1, wherein the pixel circuits are disposed in the second display region.

3. The display panel of claim 2, wherein a potential of the compensation structure is suspended.

4. The display panel of claim 2, wherein a display signal is transmitted in the compensation structure.

5. The display panel of claim 4, further comprising a transparent signal transmission line, and the transparent signal transmission line is disposed between a film in which the anode is located and a film in which the compensation structure is located; and
a pixel circuit of the pixel circuits is electrically connected to the anode via the transparent signal transmission line and the compensation structure.

6. The display panel of claim 5, wherein the first display region comprises a first display sub-region located closer to a side of the second display region; and the pixel circuit is electrically connected to an anode of a light-emitting element in the first display sub-region via the transparent signal transmission line and the compensation structure, or
wherein the first display region comprises a first display sub-region located closer to a side of the second display region and a second display sub-region located on a side of the first display sub-region facing away from the second display region;
the transparent signal transmission line comprises a first transparent signal transmission line and a second transparent signal transmission line;
the pixel circuit is electrically connected to an anode of a light-emitting element in the first display sub-region via the first transparent signal transmission line;
the pixel circuit is electrically connected to an anode of a light-emitting element in the second display sub-region via the second transparent signal transmission line and the compensation structure; and the anode of the light-emitting element in the first display sub-region at least partially overlaps the compensation structure in the first direction.

7. The display panel of claim 2, wherein the second display region comprises a third display sub-region and a fourth display sub-region;
the third display sub-region surrounds at least part of the first display region, and the fourth display sub-region surrounds at least part of the third display sub-region;
the third display sub-region comprises a plurality of second light-emitting elements, and the fourth display sub-region comprises a plurality of third light-emitting elements;
the pixel circuits comprises first pixel circuits and second pixel circuits, the first pixel circuits are disposed in the third display sub-region, and the second pixel circuits are disposed in the fourth display sub-region; and a first pixel circuit of the first pixel circuits is configured to drive a second light-emitting element of the plurality of second light-emitting elements and a first light-emitting element of the plurality of first light-emitting elements, and a second pixel circuit of the second pixel circuits is configured to drive a third light-emitting element of the plurality of third light-emitting elements.

8. The display panel of claim 1, further comprising a non-display region, wherein the non-display region surrounds at least part of the second display region, and the second display region comprises a plurality of fourth light-emitting elements;
wherein the pixel circuits comprise third pixel circuits and fourth pixel circuits, a third pixel circuit of the third pixel circuits is configured to drive a first light-emitting element of the plurality of first light-emitting elements to emit light, and a fourth pixel circuit of the fourth pixel circuits is configured to drive a fourth light-emitting element of the plurality of fourth light-emitting elements to emit light; and
wherein at least part of the third pixel circuits are disposed in the non-display region, and the fourth pixel circuits are disposed in the second display region.

9. The display panel of claim 1, wherein the anode covers the compensation structure in the first direction.

10. The display panel of claim 1, wherein a compensation film of the at least one layer of compensation film comprises a metal compensation film.

11. The display panel of claim 10, wherein the pixel circuit comprises at least one metal layer; and the metal layer in the pixel circuit and the metal compensation film are disposed in a same layer.

12. The display panel of claim 11, wherein the at least one layer of compensation film comprises a first compensation film and a second compensation film, and the second compensation film is located on a side of the first compensation film facing away from the substrate;
   the pixel circuit comprises at least a first metal layer and a second metal layer, and the second metal layer is located on a side of the first metal layer facing away from the substrate; and
   the first compensation film and the first metal layer are disposed in a same layer, and the second compensation film and the second metal layer are disposed in a same layer.

13. The display panel of claim 12, wherein the at least one layer of compensation film further comprises a third compensation film, and the third compensation film is disposed between the first compensation film and the second compensation film;
   the pixel circuit further comprises a capacitor substrate layer, and the capacitor substrate layer is disposed between the first metal layer and the second metal layer; and
   the third compensation film and the capacitor substrate layer are disposed in a same layer,
   wherein the at least one layer of compensation film further comprises a fourth compensation film located on a side of the first compensation film closer to the substrate;
   the pixel circuit further comprises an active layer located on a side of the first metal layer closer to the substrate; and
   the fourth compensation film and the active layer are disposed in a same layer,
   wherein the display panel satisfies at least one of:
   the second compensation film is electrically connected to the first compensation film through a via;
   the second compensation film is electrically connected to the third compensation film through a via; or
   the second compensation film is electrically connected to the fourth compensation film through a via.

14. The display panel of claim 11, wherein the pixel circuit comprises at least a first metal layer and a second metal layer, and the second metal layer is located on a side of the first metal layer facing away from the substrate; and
   the metal compensation film and the second metal layer are disposed in a same layer.

15. The display panel of claim 1, wherein the first display region comprises a first display opening region, and the first display opening region at least partially overlaps the compensation structure in the first direction.

16. The display panel of claim 15, wherein the second display region comprises a second display opening region; and
   in the first direction, a relative positional relationship between the first display opening region and the compensation structure is the same as a relative positional relationship between the second display opening region and the pixel circuit,
   wherein a film structure of the compensation structure is the same as a film structure of the pixel circuit.

17. The display panel of claim 1, wherein the plurality of first light-emitting elements comprises a first red light-emitting element, a first green light-emitting element, and a first blue light-emitting element;
   the first red light-emitting element comprises a first sub-anode, the first green light-emitting element comprises a second sub-anode, and the first blue light-emitting element comprises a third sub-anode;
   the compensation structure comprises a first compensation structure, a second compensation structure, and a third compensation structure;
   in the first direction, the first sub-anode at least partially overlaps the first compensation structure, the second sub-anode at least partially overlaps the second compensation structure, and the third sub-anode at least partially overlaps the third compensation structure; and
   a sum of surface areas of the third compensation structure is greater than a sum of surface areas of the first compensation structure, and the sum of the surface area of the first compensation structure is greater than a sum of surface areas of the second compensation structure.

18. The display panel of claim 1, wherein the plurality of first light-emitting elements comprises a first red light-emitting element, a first green light-emitting element, and a first blue light-emitting element;
   the first red light-emitting element comprises a first sub-anode, the first green light-emitting element comprises a second sub-anode, and the first blue light-emitting element comprises a third sub-anode;
   the compensation structure comprises a first compensation structure, a second compensation structure, and a third compensation structure;
   in the first direction, the first sub-anode at least partially overlaps the first compensation structure, the second sub-anode at least partially overlaps the second compensation structure, and the third sub-anode at least partially overlaps the third compensation structure; and
   a structure of the first compensation structure is the same as a structure of the second compensation structure and a structure of the third compensation structure.

19. A display device, comprising a display panel,
   wherein the display panel comprises a first display region and a second display region;
   wherein the display panel further comprises pixel circuits, and the pixel circuits are configured to drive light-emitting elements to emit light; wherein a distribution density of the pixel circuits in the first display region is less than a distribution density of the pixel circuits in the second display region;
   wherein the first display region comprises a compensation structure, and the compensation structure comprises at least one layer of compensation film; and
   wherein the first display region further comprises a plurality of first light-emitting elements, and each of the plurality of first light-emitting elements comprises an anode; the anode at least partially overlaps the compensation structure in a first direction; and the display panel further comprises a substrate, and the first direction is perpendicular to a plane in which the substrate is located,
   wherein the display device comprises a sensor;
   wherein the display panel further comprises a sensor reservation area, and the sensor is disposed in the sensor reservation area; and wherein the first display region also serves as the sensor reservation area;
   wherein the pixel circuits comprise fifth pixel circuits and sixth pixel circuits, the fifth pixel circuits are disposed in the first display region, and the sixth pixel circuits are disposed in the second display region;
   the second display region further comprises a plurality of fourth light-emitting elements; and
   a fifth pixel circuit of the fifth pixel circuits is configured to drive at least two of the plurality of first light-emitting elements, and a sixth pixel circuit of the sixth pixel circuits is configured to drive a fourth light-emitting element of the plurality of fourth light-emitting elements, and wherein the plurality of first light-emitting elements comprises first light-emitting sub-elements; in the first direction, the first light-emitting sub-element does not overlap the fifth pixel circuit, and the first light-emitting sub-element does not overlap a connection line between two adjacent fifth pixel circuits of the fifth pixel circuits; and in the first direction, an anode of the first light-emitting sub-element at least partially overlaps the compensation structure.

\* \* \* \* \*